United States Patent
Jung et al.

(10) Patent No.: US 9,698,158 B2
(45) Date of Patent: Jul. 4, 2017

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Won-Seok Jung, Anyang-si (KR); Changseok Kang, Seongnam-si (KR); Seungwoo Paek, Yongin-si (KR); Inseok Yang, Hwaseong-si (KR); Kyungjoong Joo, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/248,564

(22) Filed: Aug. 26, 2016

(65) Prior Publication Data

US 2016/0365356 A1 Dec. 15, 2016

Related U.S. Application Data

(62) Division of application No. 14/801,470, filed on Jul. 16, 2015, now Pat. No. 9,484,355.

(30) Foreign Application Priority Data

Jul. 23, 2014 (KR) .................. 10-2014-0093314

(51) Int. Cl.
 *H01L 21/336* (2006.01)
 *H01L 27/11582* (2017.01)
 (Continued)

(52) U.S. Cl.
 CPC .. *H01L 27/11582* (2013.01); *H01L 27/11573* (2013.01); *H01L 27/11575* (2013.01)

(58) Field of Classification Search
 CPC ......... H01L 27/11582; H01L 27/11575; H01L 27/11573
 (Continued)

(56) References Cited

U.S. PATENT DOCUMENTS 7,821,058 B2 10/2010 Kidoh et al.
7,936,004 B2 5/2011 Kito et al.
(Continued)

FOREIGN PATENT DOCUMENTS

JP 2009146954 7/2009
KR 1020090128776 12/2009
(Continued)

*Primary Examiner* — Anthony Ho
(74) *Attorney, Agent, or Firm* — F.Chau & Associates, LLC

(57) ABSTRACT

A semiconductor device includes a substrate, a stack structure, peripheral gate structures and residual spacers. The substrate includes a cell array region and a peripheral circuit region. The stack structure is disposed on the cell array region, having electrodes and insulating layers alternately stacked. The peripheral gate structures are disposed on the peripheral circuit region, being spaced apart from each other in one direction and having a peripheral gate pattern disposed on the substrate, and a peripheral gate spacer disposed on a sidewall of the peripheral gate pattern. The residual spacers are disposed on sidewalls of the peripheral gate structures, having a sacrificial pattern and an insulating pattern that are stacked. The insulating pattern includes substantially the same material as the insulating layers of the stack structure.

12 Claims, 21 Drawing Sheets

(51) Int. Cl.
*H01L 27/11575* (2017.01)
*H01L 27/11573* (2017.01)

(58) Field of Classification Search
USPC .......................................................... 438/268
See application file for complete search history.

(56) References Cited

U.S. PATENT DOCUMENTS

| | | |
|---|---|---|
| 8,013,383 B2 | 9/2011 | Kidoh et al. |
| 8,426,304 B2 | 4/2013 | Yoo et al. |
| 8,440,542 B2 | 5/2013 | Sekar et al. |
| 8,441,059 B2 | 5/2013 | Sim et al. |
| 8,643,076 B2 | 2/2014 | Seo et al. |
| 2012/0061744 A1 | 3/2012 | Hwang et al. |
| 2012/0070944 A1 | 3/2012 | Kim et al. |
| 2012/0108048 A1 | 5/2012 | Lim et al. |
| 2012/0168831 A1 | 7/2012 | Ahn |
| 2014/0217493 A1 | 8/2014 | Fukuzumi et al. |
| 2015/0372004 A1 | 12/2015 | Jung et al. |
| 2016/0027795 A1 | 1/2016 | Jung et al. |

FOREIGN PATENT DOCUMENTS

| | | |
|---|---|---|
| KR | 1020120030193 | 3/2012 |
| KR | 1020120048791 | 5/2012 |
| KR | 20120077005 | 7/2012 |
| KR | 1020120126399 | 11/2012 |

SEMICONDUCTOR DEVICE AND METHOD OF FABRICATING THE SAME

CROSS-REFERENCE TO RELATED APPLICATION

This application is a divisional of U.S. application Ser. No. 14/801,470 filed on Jul. 16, 2015 which claims priority under 35 U.S.C. §119 to Korean Patent Application No. 10-2014-0093314, filed on Jul. 23, 2014, in the Korean Intellectual Property Office, the disclosure of which is incorporated by reference herein in its entirety.

TECHNICAL FIELD

The inventive concepts relate to semiconductor devices and methods for fabricating the same. More particularly, the inventive concepts relate to three-dimensional (3D) semiconductor devices capable of improving reliability and an integration intensity and methods for fabricating the same.

DISCUSSION OF RELATED ART

Semiconductor devices have been highly integrated for high performance and low costs. The integration density of a conventional two-dimensional (2D) or planar memory device is mainly determined by an area which a unit memory cell occupies. Therefore, the integration density of the conventional 2D memory device depends on fine-patterning technologies which cost expensive.

Three-dimensional (3D) semiconductor devices including three-dimensionally arranged memory cells have been developed for higher integration compared to the 2D semiconductor devices.

SUMMARY

According to an exemplary embodiment of the present inventive concept, a semiconductor device includes a substrate, a stack structure, peripheral gate structures and residual spacers. The substrate includes a cell array region and a peripheral circuit region. The stack structure is disposed on the cell array region, having electrodes and insulating layers alternately stacked. The peripheral gate structures are disposed on the peripheral circuit region, being spaced apart from each other in one direction and having a peripheral gate pattern disposed on the substrate, and a peripheral gate spacer disposed on a sidewall of the peripheral gate pattern. The residual spacers are disposed on sidewalls of the peripheral gate structures, having a sacrificial pattern and an insulating pattern that are stacked. The insulating pattern includes substantially the same material as the insulating layers of the stack structure.

According to an exemplary embodiment of the present inventive concept, a method of fabricating a semiconductor device is provided. Peripheral gate structures are disposed on a peripheral circuit region of a substrate. Each peripheral gate structure includes a peripheral gate pattern, and a peripheral gate spacer disposed on a sidewall of the peripheral gate pattern. A thin layer structure is formed by stacking alternately and repeatedly sacrificial layers and insulating layers on an entire top surface of the peripheral circuit region having the peripheral gate structures. A process of patterning the thin layer structure is repeated to sequentially expose top surfaces of the insulating layers between a cell array region of the substrate and the peripheral circuit region to form a stack structure on the cell array region and residual spaces on sidewalls of the peripheral gate structures.

According to an exemplary embodiment of the present inventive concept, a semiconductor device is provided. A substrate includes a cell array region and a peripheral circuit region. A stack structure is disposed on the cell array region. First peripheral gate structures, extended in a first direction, are disposed on a first region of the peripheral circuit region. The first peripheral gate structures are spaced apart from each other at a first distance along a second direction crossing the first direction. First residual spacers are disposed in the first region, and at least two first residual spacers are interposed between two adjacent first peripheral gate structures. Second peripheral gate structures are disposed on a second region of the peripheral circuit region. The second peripheral gate structures are spaced apart from each other at a second distance along the second direction. Second residual spacers are disposed in the second region, and one second residual spacer is interposed between two adjacent second peripheral gate structures. A first peripheral contact plug is connected to the substrate and interposed between at least two first residual spacers. A second peripheral contact plug is connected to the substrate and penetrating one second residual spacer interposed between two adjacent second peripheral gate structures.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
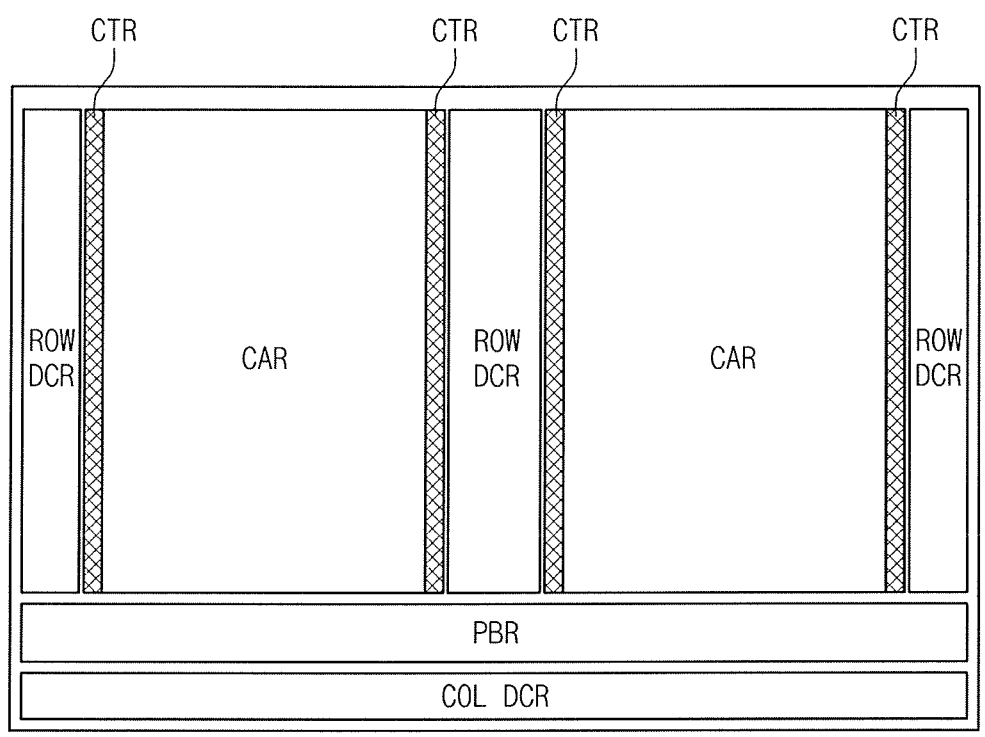
FIG. 1 is a schematic diagram illustrating a semiconductor memory device according to an exemplary embodiment of the present inventive concept.

Exemplary embodiments of the present invention will be described below in detail with reference to the accompanying drawings. However, the present invention is embodied in different forms and should not be construed as limited to the embodiments set forth herein. In the drawings, the thickness of layers and regions is exaggerated for clarity. It will also be understood that when an element is referred to as being "on" another element or substrate, it is directly on the other element or substrate, or intervening layers may also be present. It will also be understood that when an element is referred to as being "coupled to" or "connected to" another element, it is directly coupled to or connected to the other element, or intervening elements may also be present. Like reference numerals may refer to the like elements throughout the specification and drawings.

Figure 2:
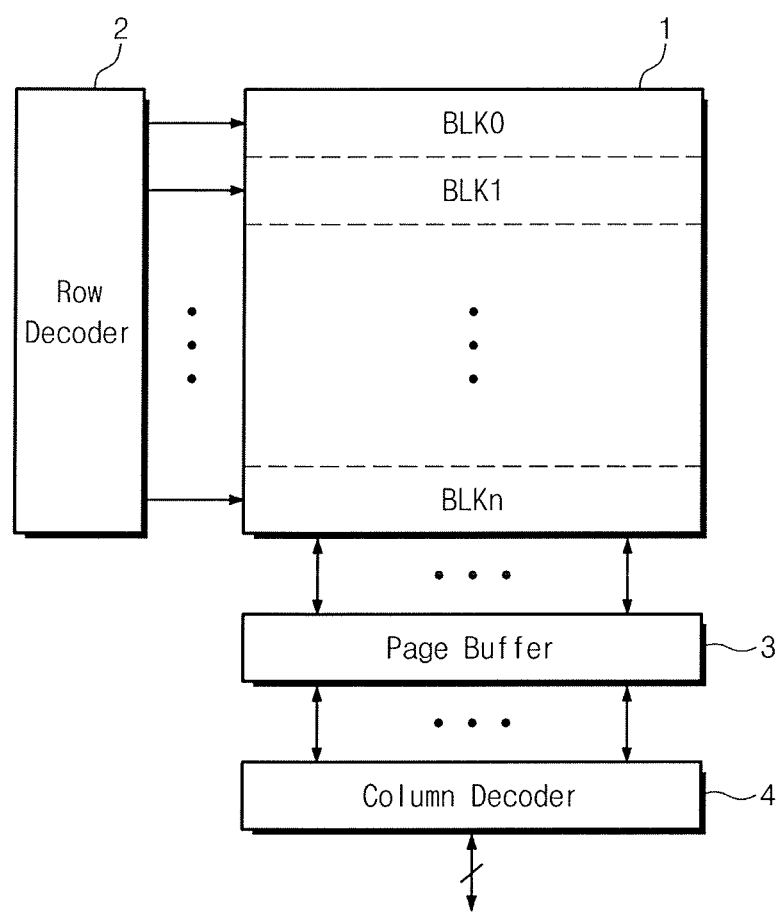
FIG. 2 is a schematic block diagram illustrating a semiconductor memory device according to an exemplary embodiment of the present inventive concept.

FIG. 1 is a schematic diagram illustrating a semiconductor memory device according to an exemplary embodiment of the present inventive concept. FIG. 2 is a schematic block diagram illustrating a semiconductor memory device according to an exemplary embodiment of the present inventive concept.

Referring to FIG. 1, a semiconductor memory device includes a cell array region CAR and a peripheral circuit region. The peripheral circuit region includes row decoder regions ROW DCR, a page buffer region PBR, and a column decoder region COL DCR. In addition, a contact region CTR is disposed between the cell array region CAR and the row decoder region ROW DCR.

Referring to FIGS. 1 and 2, a memory cell array 1 including a plurality of memory cells is disposed in the cell array region CAR. The memory cell array 1 includes the plurality of memory cells, a plurality of word lines, and a plurality of bit lines. The word lines and the bit lines are electrically connected to the memory cells. The memory cell array 1 includes a plurality of memory blocks BLK0 to BLKn. Each of the memory blocks BLK0 to BLKn may be erased at the same time. As such, data of the memory cells disposed in each of the memory blocks BLK0 to BLKn is erased at the same time. The memory cell array 1 will be described later in more detail with reference to FIGS. 3A, 3B, and 4A to 4D.

A row decoder 2 for selecting the word lines of the memory cell array 1 is disposed in the row decoder region ROW DCR. An interconnection structure for electrically connecting the memory cell array 1 to the row decoder 2 is disposed in the contact region CTR. In response to address data, the row decoder 2 may select one of the memory blocks BLK0 to BLKn and may select one of the word lines of the selected memory block. The row decoder 2 may provide word line voltages generated from a voltage-generating circuit (not shown) to the selected word line and unselected word lines, respectively.

A page buffer 3 for sensing data stored in the memory cells is disposed in the page buffer region PBR. According to an operation mode, the page buffer 3 may temporarily store data to be stored in the memory cells or may sense data stored in the memory cells. The page buffer 3 may be operated as a write driver during a program operation mode and may be operated as a sense amplifier during a read operation mode (or a sensing operation mode).

A column decoder 4 connected to the bit lines of the memory cell array 1 is disposed in the column decoder region COL DCR. The column decoder 4 may provide a data transmitting path between the page buffer 3 and an external device (e.g., a memory controller).

Figure 3A:
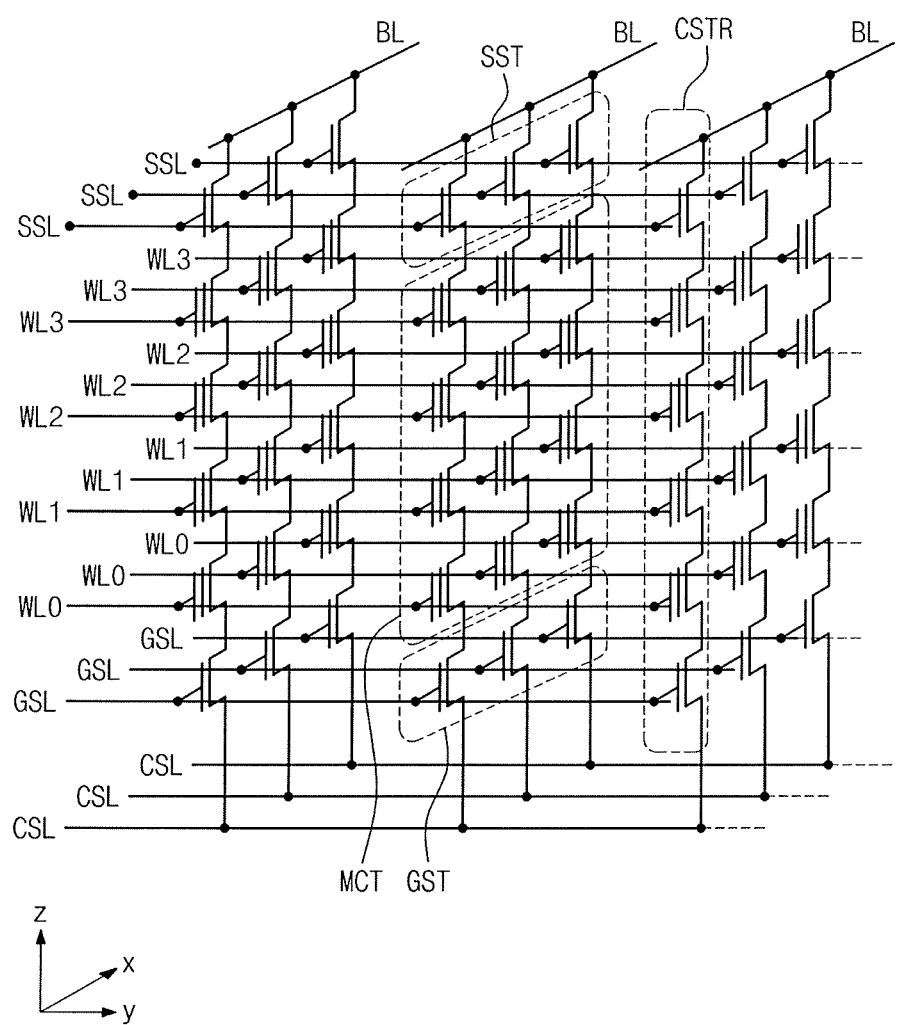
FIGS. 3A and 3B are schematic circuit diagrams illustrating cell arrays of semiconductor memory devices according to an exemplary embodiment of the present inventive concept.
Figure 3B:
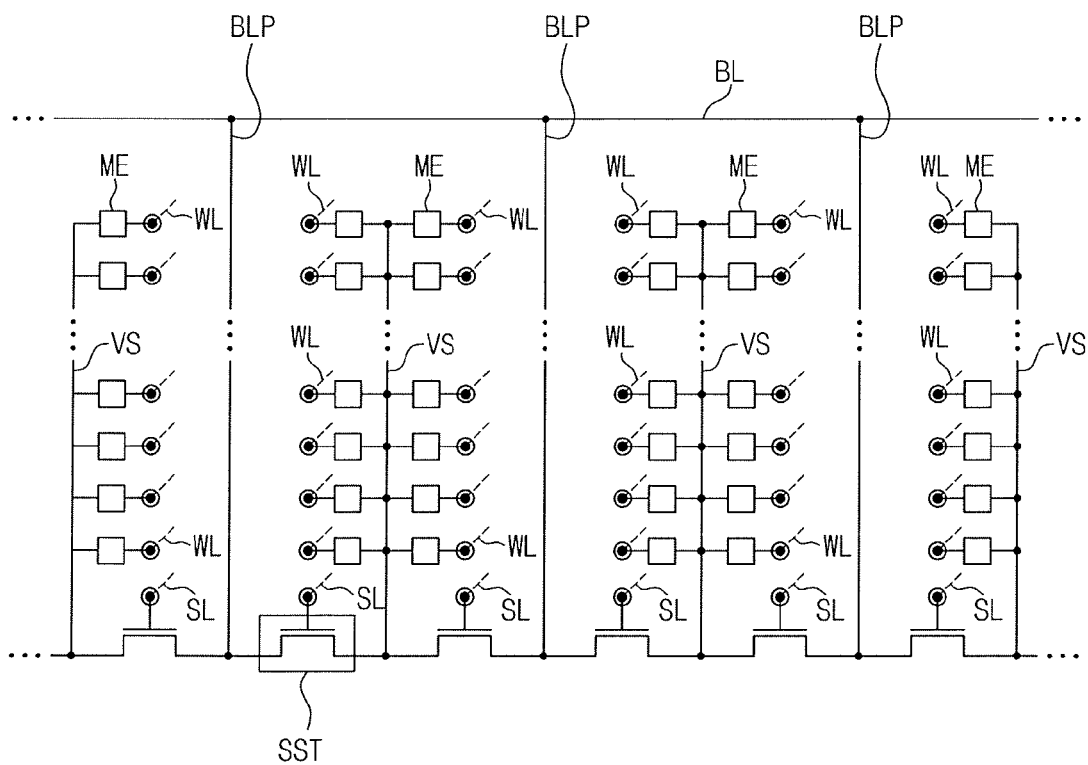

FIGS. 3A and 3B are schematic circuit diagrams illustrating a cell array of a semiconductor memory device according to an exemplary embodiment of the present inventive concept.

Referring to FIG. 3A, a cell array of a semiconductor memory device according to an exemplary embodiment includes a common source line CSL, a plurality of bit lines BL, and a plurality of cell strings CSTR disposed between the common source line CSL and the bit lines BL.

The bit lines BL are two-dimensionally arranged and a plurality of cell strings CSTR is connected in parallel to each of the bit lines BL. The cell strings CSTR are connected in common to the common source lines CSL. A plurality of cell strings CSTR is connected between one common source lines CSL and the plurality of bit lines BL. The common source line CSL includes a plurality of two-dimensionally arranged common source lines CSL. The same voltage is applied to the common source lines CSL. Alternatively, the common source lines CSL may be electrically controlled independently of each other.

Each of the cell strings CSTR includes a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST are connected in series to each other.

The common source line CSL is connected in common to sources of the ground selection transistors GST. A ground selection line GSL, a plurality of word lines WL0 to WL3, and a string selection line SSL which are disposed between the common source line CSL and the bit lines BL are used as gate electrodes of the ground selection transistor GST, the memory cell transistors MCT and the string selection transistor SST, respectively. Each of the memory cell transistors MCT includes a data storage element.

Referring to FIG. 3B, a cell array of a semiconductor memory device according to an exemplary embodiment includes memory elements ME that are connected in parallel to each of vertical structures VS. Each of the memory elements ME is connected to a corresponding one of word lines WL. Each of the word lines WL is connected to a corresponding one of the vertical structures VS through the corresponding one of the memory elements ME.

A plurality of selection transistors SST is connected in parallel to a bit line BL through a plurality of bit line plugs BLP. Each of the bit line plugs BLP is connected in common to a pair of selection transistors SST adjacent thereto.

A plurality of word lines WL and a plurality of vertical structures VS are disposed between the bit line BL and the selection transistors SST. The vertical structures VS are disposed between the bit line plugs BLP. For example, the vertical structures VS and the bit line plugs BLP are alternately arranged in a direction parallel to the bit line BL. Each of the vertical structures VS is connected in common to a pair of selection transistors SST adjacent thereto.

Each of the selection transistors SST includes a selection line SL that is used as a gate electrode of the selection transistor SST. The selection lines SL are parallel to the word lines WL.

The inventive concept is not limited to the embodiments of FIGS. 3A and 3B, and a cell array may be implemented in various forms.

FIGS. 4A to 4D are perspective views illustrating a cell array of a semiconductor memory devices according to an exemplary embodiment of the present inventive concept.

Figure 4A:
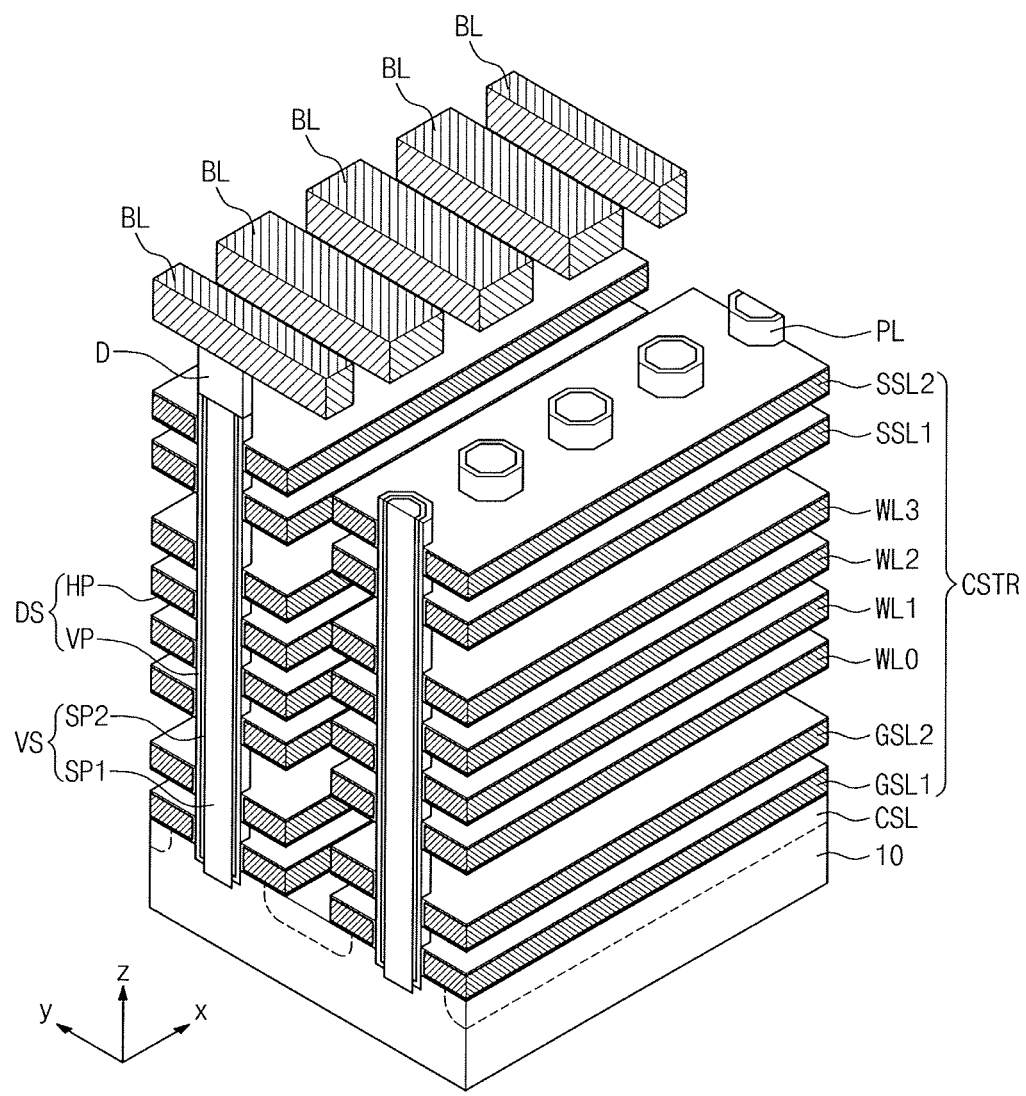
FIGS. 4A to 4D are perspective views illustrating cell arrays of semiconductor memory devices according to an exemplary embodiment of the present inventive concept.

Referring to FIG. 4A, a common source line CSL is a conductive layer disposed in a substrate 10 or a dopant region formed in the substrate 10. Bit lines BL are conductive patterns (e.g., metal lines) that are spaced apart from the substrate 10 and are disposed over the substrate 10. The bit lines BL are two-dimensionally arranged, and a plurality of cell strings CSTR is connected in parallel to each of the bit lines BL. Thus, the cell strings CSTR are two-dimensionally arranged on the common source line CSL or the substrate 10 when viewed from the above.

Each of the cell strings CSTR includes a plurality of ground selection lines GSL1 and GSL2, a plurality of word lines WL0 to WL3, and a plurality of string selection lines SSL1 and SSL2, which are disposed between the common source line CSL and the bit lines BL. The string selection lines SSL1 and SSL2 constitutes the string selection line SSL of FIG. 3A, and the ground selection lines GSL1 and GSL2 constitutes the ground selection line GSL of FIG. 3B. The ground selection lines GSL1 and GSL2, the word lines WL0 to WL3, and the string selection lines SSL1 and SSL2 are conductive patterns (e.g., gate electrodes) that are sequentially stacked on the substrate 10.

In addition, each of the cell strings CSTR includes a vertical structure VS that vertically extends from the common source line CSL to be connected to the bit line BL. The vertical structure VS penetrates the ground selection lines GSL1 and GSL2, the word lines WL0 to WL3, and the string selection lines SSL1 and SSL2. For example, the vertical structures VS may penetrate a plurality of conductive patterns stacked on the substrate 10.

The vertical structure VS may include a semiconductor material or a conductive material. If the vertical structure VS includes a semiconductor material, the vertical structure VS, as shown in FIG. 4A, includes a semiconductor body portion SP1 connected to the substrate 10 and a semiconductor spacer SP2 disposed between the semiconductor body portion SP1 and a data storage layer DS. In addition, the vertical structure VS may include a dopant region that is disposed in a top end portion of the vertical structure VS. For example, a drain region D is formed in the top end portion of the vertical structure VS.

The data storage layer DS is disposed between the vertical structures VS and the word lines WL0 to WL3. The data storage layer DS may include a charge storage layer. For example, the data storage layer DS may include at least one of a trap insulating layer, a floating gate electrode, or an insulating layer including conductive nano dots. Data stored in the data storage layer DS may be changed using Fowler-Nordheim tunneling which is caused by a voltage difference between the vertical structure VS including the semiconductor material and the word lines WL0 to WL3. Alternatively, the data storage layer DS may include a thin layer for a phase change memory or a thin layer for a variable resistance memory.

The data storage layer DS includes a vertical pattern VP penetrating the word lines WL0 to WL3 and a horizontal pattern HP. The horizontal pattern HP is disposed between the vertical pattern VP and the word lines WL0 to WL3 and disposed on top surfaces and bottom surfaces of the word lines WL0 to WL3.

A dielectric layer used as a gate dielectric layer of a transistor is disposed between the vertical structures VS and the ground selection lines GSL1 and GSL2 and/or between the vertical structures VS and the string selection lines SSL1 and SSL2. The dielectric layer may be formed of the same material as the data storage layer DS. Alternatively, the dielectric layer may be formed of a gate dielectric layer (e.g., a silicon oxide layer) for a metal-oxide-semiconductor field effect transistor (MOSFET).

In the structure described above, the vertical structures VS, the ground selection lines GSL1 and GSL2, the word lines WL0 to WL3, and the string selection lines SSL1 and SSL2 may constitute MOSFETs using the vertical structures VS as channel regions. Alternatively, the vertical structures VS, the ground selection lines GSL1 and GSL2, the word lines WL0 to WL3, and the string selection lines SSL1 and SSL2 may constitute metal-oxide-semiconductor capacitors (MOS capacitors).

The ground selection lines GSL1 and GSL2, the word lines WL0 to WL3, and the string selection lines SSL1 and SSL2 may be used as gate electrodes of ground selection transistors, gate electrodes of cell transistors, and gate electrodes of string selection transistors, respectively. Inversion regions may be generated in the vertical structures VS by fringe fields that are generated by voltages applied to the ground selection lines GSL1 and GSL2, the word lines WL0 to WL3, and the string selection lines SSL1 and SSL2. In this case, the maximum distance (or width) of the inversion region may be greater than thicknesses of the word lines WL0 to WL3 and/or the selection lines GSL1, GSL2, SSL1, and SSL2 generating the inversion regions. Thus, the inversion regions generated in the vertical structure VS may be vertically connected with each other to form a current path that electrically connects the common source line CSL to a selected bit line.

For example, the cell string CSTR includes ground selection transistors including the ground selection lines GSL1 and GSL2, cell transistors including the word lines WL0 to WL3, and string selection transistors including the string selection lines SSL1 and SSL2, which are connected in series to one another.

Figure 4B:
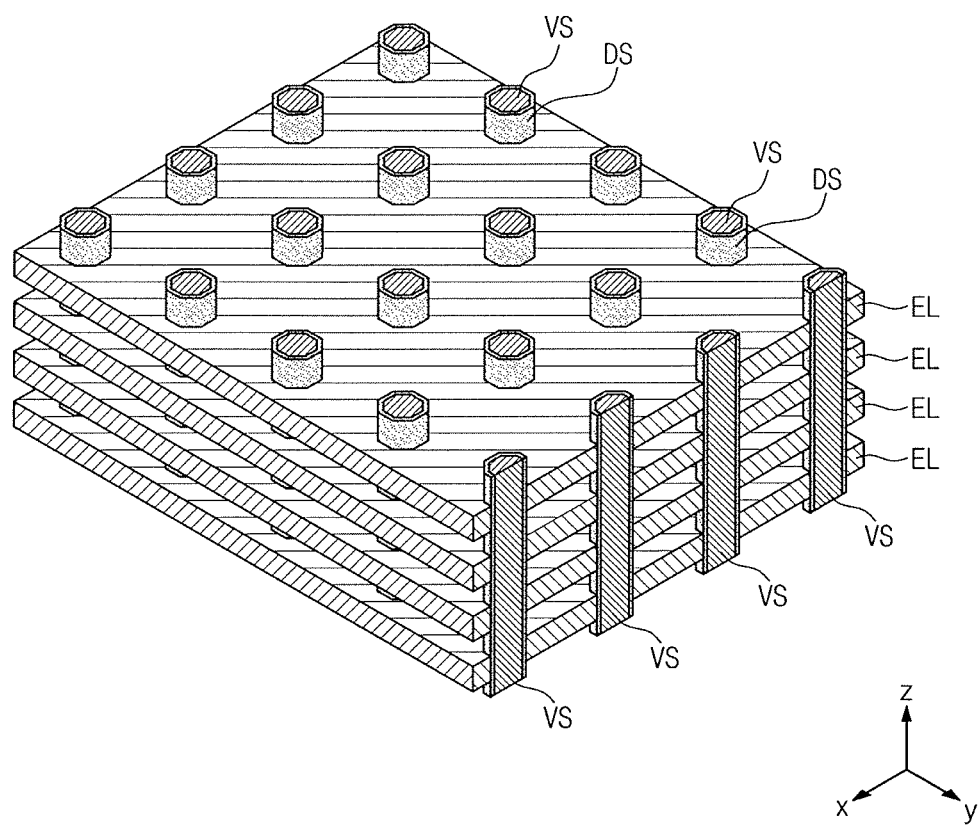
Figure 4C:
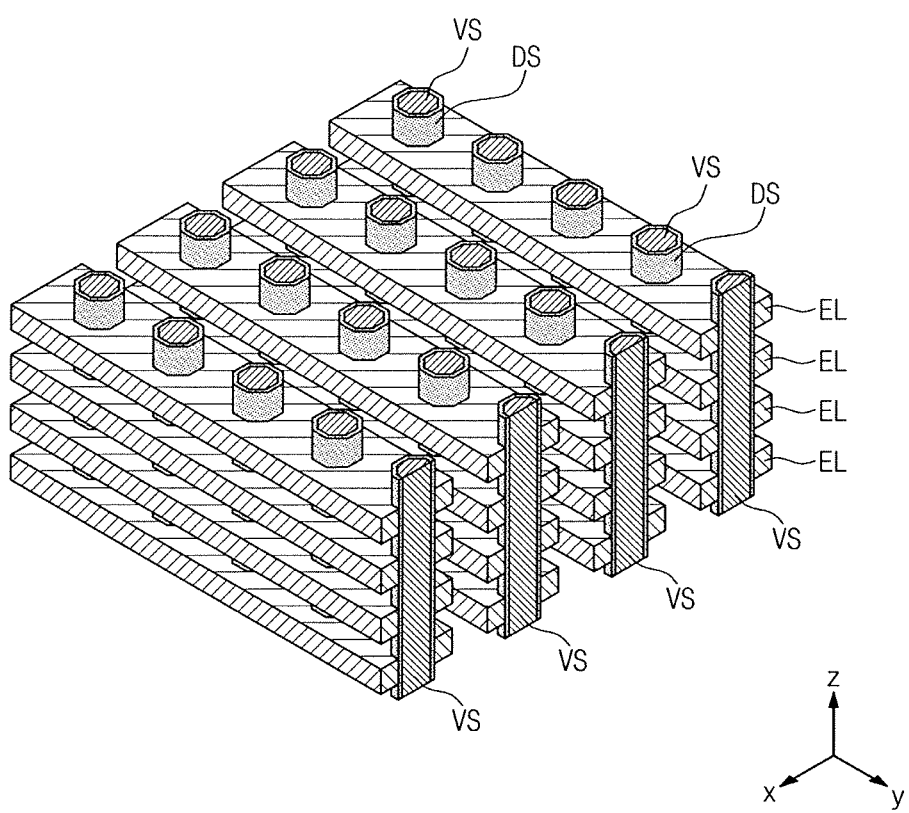

Referring to FIGS. 4B to 4C, a cell array of a semiconductor memory device according to an exemplary embodiment includes a plurality of horizontal electrodes EL and a plurality of vertical structures VS. The horizontal electrodes EL are parallel to an x-y plane and are disposed at different heights from a substrate, respectively. The vertical structures VS are vertical to the horizontal electrodes EL. In addition, the cell array further includes data storage layers DS disposed between the horizontal electrodes EL and sidewalls of the vertical structures VS. The horizontal electrodes EL shown in FIGS. 4B to 4D may correspond to the lines GSL, WL0 to WL3, and SSL of FIG. 3A and the lines GSL1, GSL2, WL0 to WL3, SSL1, and SSL2 of FIG. 3B.

Referring to FIG. 4B, each of horizontal electrodes EL has a plate shape. For example, lengths of each horizontal electrode EL in x and y directions may be ten or more times greater than those of each vertical structure VS, respectively. Each horizontal electrode EL has holes that are two-dimensionally arranged and penetrate each horizontal electrode EL. Each vertical structure VS is disposed in the holes of the horizontal electrodes EL which are disposed at heights different from each other.

Referring to FIG. 4C, horizontal electrodes EL are separated from each other in x and z directions so that the horizontal electrodes EL are three-dimensionally arranged. Each horizontal electrode EL has a line shape. A plurality of vertical structures VS penetrates the horizontal electrode EL. For example, a length of each horizontal electrode EL may be ten or more times greater than a width of the vertical structure VS, and a width of each horizontal electrode EL may be substantially equal to or less than three times the width of the vertical structure VS. Each horizontal electrode EL may have holes that are one-dimensionally arranged and penetrate each horizontal electrode EL. The vertical structure VS are disposed in the holes of the horizontal electrodes EL which are sequentially stacked.

Figure 4D:
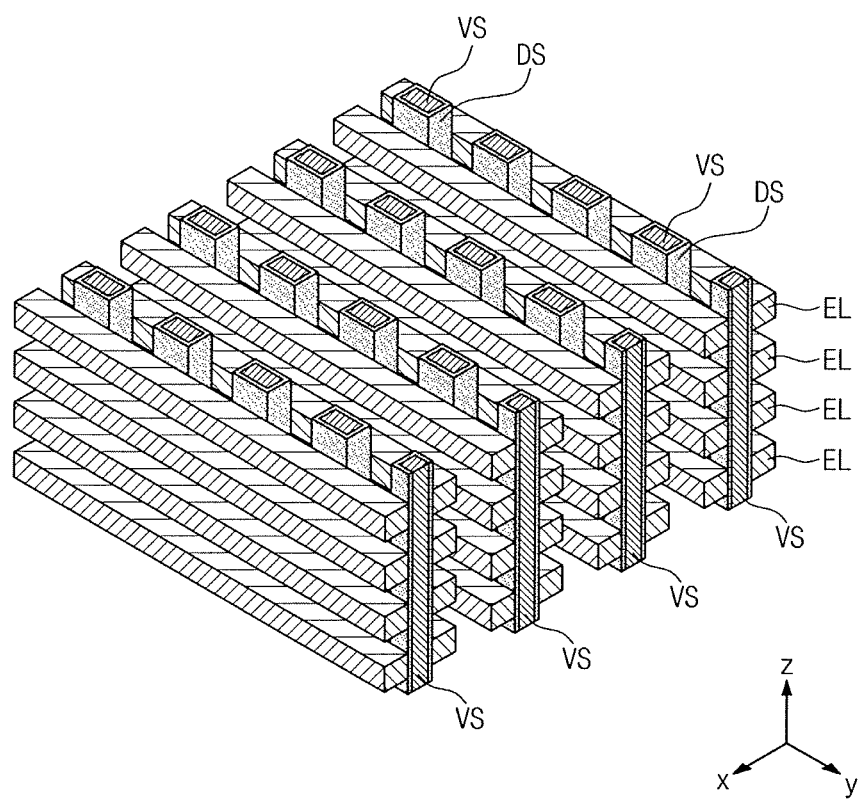

Referring to FIG. 4D, horizontal electrodes EL are separated from each other in x and z directions so that the horizontal electrode EL are three-dimensionally arranged. Each horizontal electrode EL may have a line shape. The vertical structures VS are horizontally spaced apart from each other in a direction where the horizontal electrodes El are extended. A pair of horizontal electrodes EL disposed at left and right sides of each vertical structure VS is horizontally separated from each other. Each of the pair of horizontal electrodes EL is controlled independently and thus may have potentials different from each other. For example, one of the pair of horizontal electrodes EL may be connected to a peripheral circuit through its left end, and the other of the pair of horizontal electrodes EL may be connected to another peripheral circuit through its right end.

Alternatively, the pair of horizontal electrodes EL disposed at the left and right sides of each vertical structure VS may be electrically connected to each other so that the pair of horizontal electrodes EL are controlled together. In this case, the pair of horizontal electrodes EL is in an equipotential state.

Figure 5:
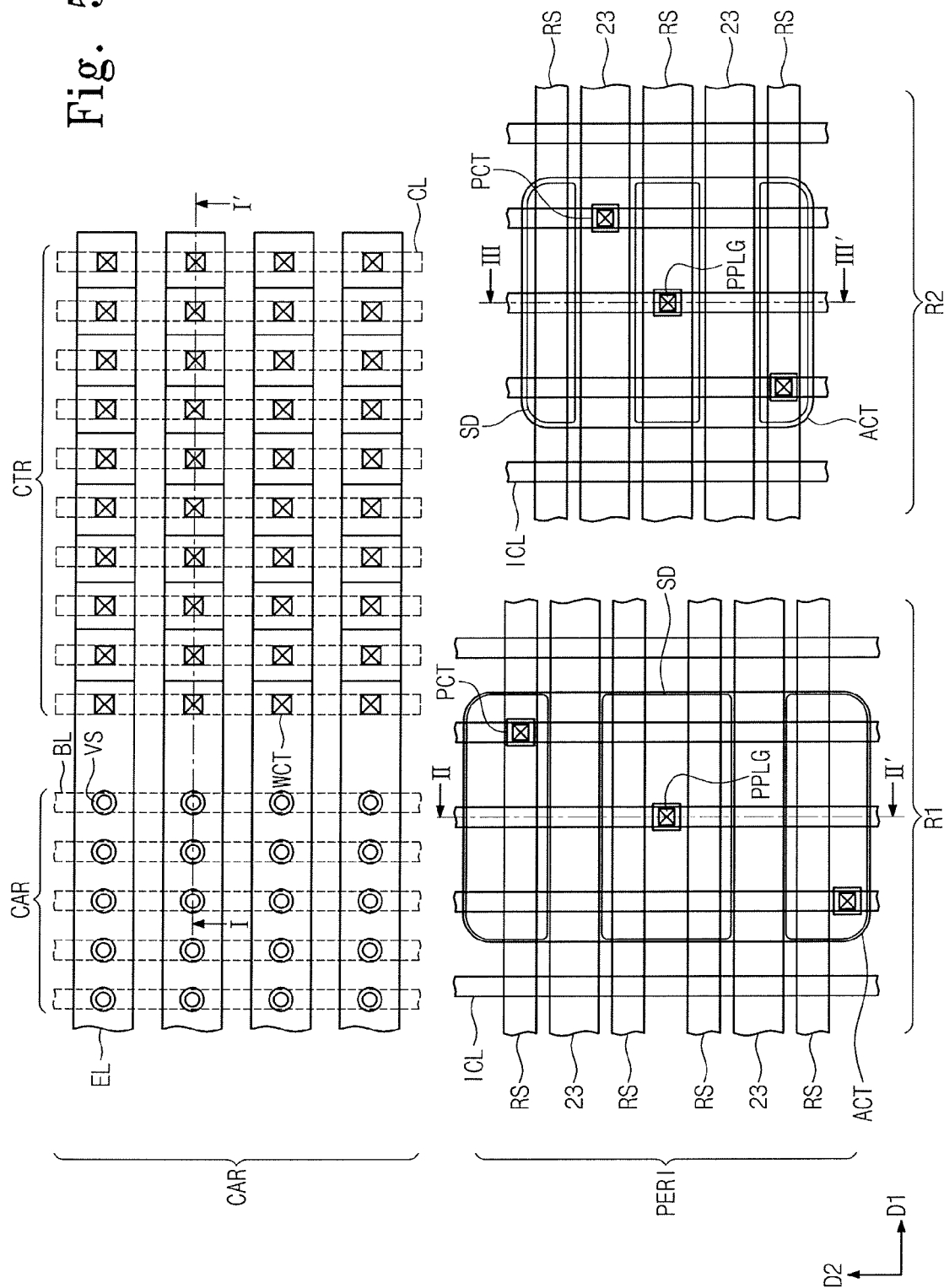
FIG. 5 is a plan view illustrating a semiconductor memory device according to an exemplary embodiment of the present inventive concept.
Figure 6:
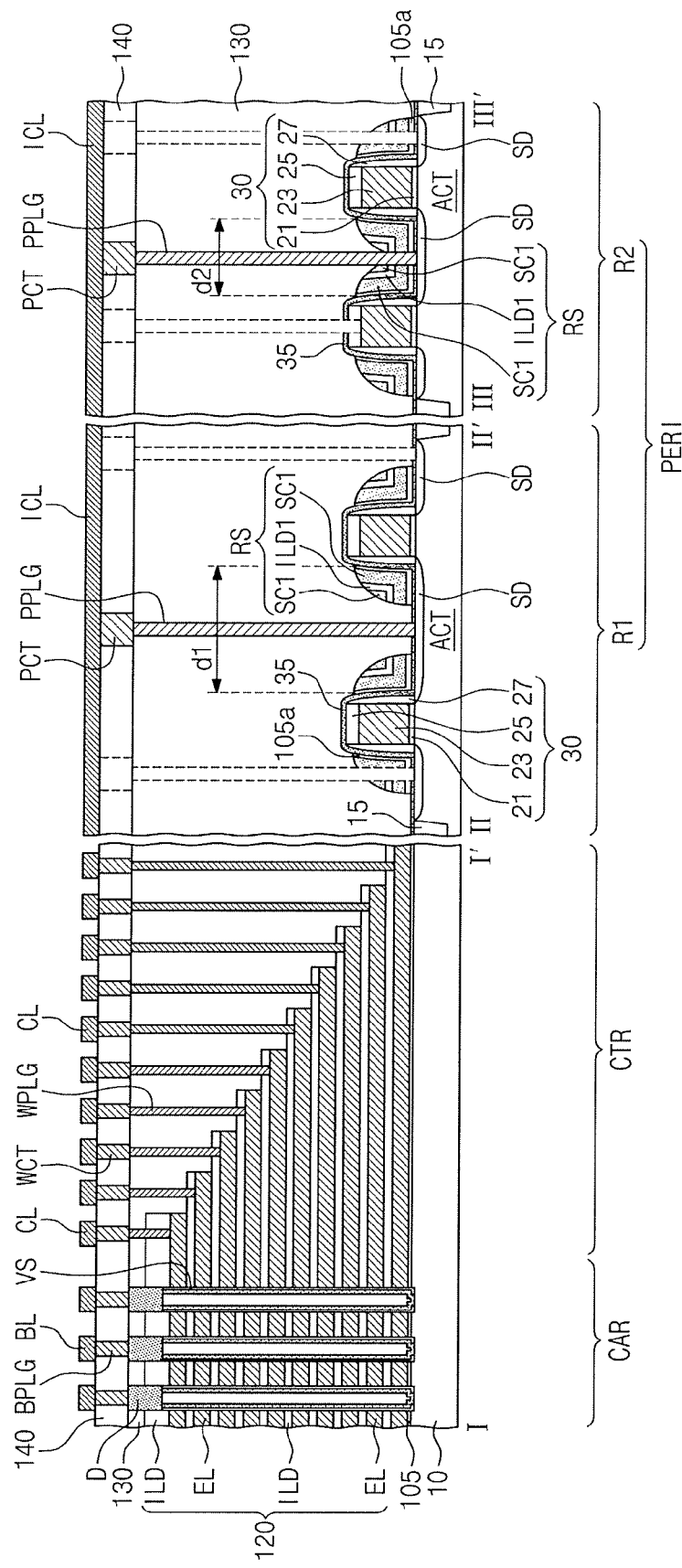
FIG. 6 is a cross-sectional view taken along lines I-I', II-II', and III-III' of FIG. 5 to illustrate a semiconductor memory device according to an exemplary embodiment of the present inventive concept.

FIG. 5 is a plan view illustrating a semiconductor memory device according to an exemplary embodiment of the present inventive concept. FIG. 6 is a cross-sectional view taken along lines I-I', II-II', and III-III' of FIG. 5 to illustrate a semiconductor memory device according to an exemplary embodiment of the present inventive concept.

Referring to FIGS. 5 and 6, a substrate 10 includes a cell array region CAR, a peripheral circuit region PERI, and a contact region CTR disposed between the cell array region CAR and the peripheral circuit region PERI. The substrate 10 may be a substrate including a material having a semiconductor property (e.g., a silicon wafer), a substrate including an insulating material (e.g., a glass substrate), or a semiconductor or conductor covered with an insulating material.

A cell array structure is disposed on the substrate 10 of the cell array region CAR. The cell array structure has a first height on a top surface of the substrate 10 and extends from the cell array region CAR into the contact region CTR. The peripheral circuit region PERI includes a first region R1 and a second region R2. A peripheral logic structure is disposed on the substrate 10 of each of the first and second regions R1 and R2. The peripheral logic structure has a second height smaller than the first height.

The cell array structure includes a plurality of stack structures 120 and vertical structures VS penetrating the stack structures 120. Each of the stack structures 120 includes electrodes EL that are vertically stacked on the substrate 10. As shown in FIGS. 5 and 6, the stack structures 120 extend in a first direction D1 and are spaced apart from each other at a predetermined interval in a second direction D2. The stack structures 120 have inclined sidewalls. For example, the stack structure 120 has a stepwise structure that is disposed in the contact region CTR for electrical connections between the peripheral logic structures and the electrodes EL. Thus, a vertical height of the stack structure 120 may increase in the contact region CTR as a horizontal distance from the cell array region CAR is reduced. For example, the stack structure 120 may have a sloped profile in the contact region CTR.

The stack structure 120 further includes insulating layers ILD, each of which is disposed between the electrodes EL vertically adjacent to each other. Thicknesses of the insulating layers ILD may be substantially equal to each other. Alternatively, the thickness of at least one of the insulating layers ILD may be different from those the other insulating layers ILD. End portions of the electrodes EL are disposed on the substrate 10 of the contact region CTR, and the stack structures 120 have the stepwise structures on the substrate 10 of the contact region CTR. For example, the area of an electrode EL is reduced as the electrode EL is distant from the top surface of the substrate 10 increases. One-sidewalls of the electrodes EL are disposed at horizontal positions different from each other in the contact region CTR.

A lower insulating layer 105 is disposed between the substrate 10 and the stack structure 120 in the cell array region CAR and the contact region CTR. The lower insulating layer 105 may include, for example, a silicon oxide layer. The lower insulating layer 105 may be thinner than the electrodes EL and the insulating layers ILD which are included in the stack structure 120.

The vertical structures VS penetrate the stack structures 120 to be connected to the substrate 10. The vertical structures VS may include a semiconductor material or a conductive material. According to some embodiments, the vertical structure VS includes a semiconductor body portion connected to the substrate 10 and a semiconductor spacer disposed between the semiconductor body portion and the data storage layer, as described with reference to FIG. 4A. The data storage layer may include a vertical insulating pattern vertically extending between the vertical structure VS and the electrodes EL and a horizontal insulating pattern extending from between the vertical insulating pattern and the electrodes EL onto bottom surfaces and top surfaces of the electrodes EL. The vertical structures VS penetrating each of the stack structures 120 may be arranged along one direction when viewed from the above. Alternatively, the vertical structures VS penetrating each of the stack structures 120 may be arranged in a zigzag form along one direction when viewed from the above. A conductive pad D is disposed in a top end portion of the vertical structure VS. The conductive pad D may be a dopant region doped with dopants or may be formed of a conductive material.

Bit lines BL are disposed on the cell array structure. The bit lines BL are disposed on the stack structures 120 and extend in the second direction D2. The bit lines BL are electrically connected to the vertical structures VS through bit line contact plugs BPLG.

A filling insulating layer 130 is disposed on an entire top surface of the substrate 10 to cover the stack structures 120 and the peripheral logic structures. The filling insulating layer 130 has a planarized top surface, covering an end portion of the stack structure 120.

An interconnection structure for electrically connecting the cell array structure to the peripheral logic structures is disposed on the substrate 10 of the contact region CTR. For example, word lines contact plugs WPLG penetrate the filling insulating layer 130 to be connected to the end portions of the electrodes EL in the contact region CTR. A Vertical height of a word line contact plug WPLG is reduced as the word line contact plug WPLG is closer to the cell array region CAR. Top surfaces of the word line contact plugs WPLG are coplanar with each other. The top surfaces of the word line contact plugs WPLG may be coplanar with top surfaces of the vertical structures VS.

An interlayer insulating layer 140 is disposed on the filling insulating layer 130. Connection lines CL are disposed on the interlayer insulating layer 140 of the contact region CTR. The connection lines CL are electrically connected to the word line contact plugs WPLG through word line contacts WCT.

The peripheral logic structures of the peripheral circuit region PERI may include the peripheral circuits such as the row and column decoders 2 and 4, the page buffer 3, and the control circuits described with reference to FIGS. 1 and 2. For example, the peripheral logic structures may include N-type metal-oxide-semiconductor (NMOS) and/or P-type metal-oxide-semiconductor (PMOS) transistors, at least one resistor, and at least one capacitor which are electrically connected to the cell array structure.

A device isolation layer 15 is disposed in the substrate 10 of the peripheral circuit region PERI to define active regions ACT. The peripheral logic structure of the peripheral circuit region PERI includes a peripheral gate structure 30 extending in the first direction D1 and crossing the active region ACT, source/drain regions SD formed in the active region ACT at both sides of the peripheral gate structure 30, and a peripheral protection layer 35 covering the peripheral circuits.

The peripheral gate structure 30 includes a peripheral gate dielectric pattern 21, a peripheral gate pattern 23, and a peripheral gate capping pattern 25 which are sequentially stacked on the substrate 10 of the peripheral circuit region PERI. The peripheral gate structure 30 further includes peripheral gate spacers 27 disposed on both sidewalls of the peripheral gate pattern 23. The peripheral gate structure 30 is provided in plurality. For example, the plurality of peripheral gate structures 30 may cross the active region ACT to extend in the first direction D1. The plurality of peripheral gate structures 30 is spaced apart from each other in the second direction D2 intersecting the first direction D1. A first distance d1 between the peripheral gate structures 30 adjacent to each other in the first region R1 is greater than a second distance d2 between the peripheral gate structures 30 adjacent to each other in the second region R2.

The peripheral gate dielectric pattern 21 may include at least one of a silicon oxide layer, a silicon nitride layer, a silicon oxynitride layer, and a high-k dielectric layer (e.g., a hafnium oxide layer). The peripheral gate pattern 23 may include at least one of a doped semiconductor (e.g., doped silicon), a conductive metal nitride (e.g., titanium nitride or tantalum nitride), a metal (e.g., tungsten or aluminum), a transition metal (e.g., titanium or tantalum), and a metal-semiconductor compound (e.g., a metal silicide). The peripheral gate capping pattern 25 and the peripheral gate spacer 27 may include a material having etch selectivity with respect to a sacrificial pattern SC1 that is included in a residual spacer RS to be described later. For example, if the sacrificial pattern SC1 is formed of silicon nitride, the peripheral gate capping pattern 25 and the peripheral gate spacer 27 may be formed of silicon oxide. The source/drain regions SD may be regions doped with dopants. The active region ACT may be doped with dopants of a first conductivity type, and the source/drain regions SD may be doped with dopants of a second conductivity type different from the first conductivity type. The peripheral gate patterns 23 may be used as gate electrodes of the MOS transistors of the peripheral circuits, and the source/drain regions SD may be used as sources and drains of the MOS transistors.

The peripheral protection layer 35 covers the peripheral gate structure 30 and the substrate 10 of the peripheral circuit region PERI. For example, the peripheral protection layer 35 covers the substrate 10 of the peripheral circuit region PERI on which the peripheral gate structure 30 are formed. The peripheral protection layer 35 may include a nitride layer (e.g., a silicon nitride layer). A thickness of the peripheral protection layer 35 is smaller than a vertical thickness of the peripheral gate pattern 23. Here, the vertical thickness means a length in a direction perpendicular to the top surface of the substrate 10.

Residual spacers RS are respectively disposed on both sidewalls of each of the peripheral gate structures 30 covered with the peripheral protection layer 35. For example, the residual spacers RS are disposed on the peripheral protection layer 35 to be disposed on the both sidewalls of the peripheral gate structure 30. The peripheral protection layer 35 is disposed between the residual spacer RS and the substrate 10 and between the residual spacer RS and the peripheral gate structure 30. The residual spacer RS may include a plurality of layers that are formed of different materials from each other. For example, the residual spacer RS includes a sacrificial pattern SC1 and an insulating pattern ILD1 that are stacked. The insulating pattern ILD1 may include the same material as the lowermost insulating layer ILD of the stack structure 120. The sacrificial pattern SC1 may include a material having etch selectivity with respect to the insulating pattern ILD1. For example, the sacrificial pattern SC1 may include a different material from the insulating pattern ILD1 and may include at least one of a silicon layer, a silicon oxide layer, a silicon carbide layer, and a silicon nitride layer. For example, the residual spacer RS may include at least two sacrificial patterns SC1 and at least two insulating patterns ILD1 which are alternately stacked. The numbers of the sacrificial pattern SC1 and the insulating pattern ILD1 included in the residual spacer RS may be changed depending on a vertical thickness of each of the insulating layers ILD and the electrodes EL, the height of the peripheral gate structures 30, and/or a process recipe for forming the stack structure 120. Each of the residual spacers RS extends along each sidewall of the peripheral gate structure 30 in the first direction D1. Each of the residual spacers RS overlaps the source/drain region SD when viewed from the above. A top end of the residual spacer RS is lower than the top surface of the peripheral gate structure 30. Alternatively, the top end of the residual spacer RS may be disposed at substantially the same height as the top surface of the peripheral gate structure 30.

At least a portion of the residual spacers RS disposed on the sidewalls of the peripheral gate structures 30 in the second region R2 may have a different shape from the residual spacers RS disposed on the sidewalls of the peripheral gate structures 30 in the first region R1. For example, the residual spacers RS provided in the first region R1 are locally disposed on the both sidewalls of each of the peripheral gate structures 30, respectively. Thus, the residual spacers RS between the peripheral gate structures 30 adjacent to each other in the first region R1 are spaced apart from each other. In this case, the residual spacer RS include the sacrificial pattern SC1 having a substantially 'L'-shaped cross section and the insulating pattern ILD1 having a substantially 'L'-shaped cross section. On the other hand, the residual spacer RS disposed between the peripheral gate structures 30 adjacent to each other in the second region R2 is disposed on sidewalls, facing each other, of the adjacent peripheral gate structures 30 and may extend onto the substrate 10 between the adjacent peripheral gate structures 30. For example, the residual spacer 30 formed in one body is disposed between the adjacent peripheral gate structures 30 of the second region R2. In this case, the residual spacer RS between the adjacent peripheral gate structures 30 in the second region R2 includes the sacrificial pattern SC1 having a substantially 'U'-shaped cross section and the insulating pattern ILD1 having a substantially 'U'-shaped cross section.

In some embodiments, a lower insulating pattern 105a is disposed between the peripheral gate structure 30 and the residual spacer RS. The lower insulating pattern 105a may include the same material as the lower insulating layer 105 disposed between the substrate 10 and the stack structure 120.

A plurality of interconnections ICL is disposed on the interlayer insulating layer 140 of the peripheral circuit region PERI. The plurality of interconnections ICL may extend from the peripheral circuit region PERI into the cell array region CAR. The plurality of interconnections ICL may be formed of the same conductive material as the bit lines BL of the cell array region CAR.

The plurality of interconnections ICL may extend in parallel along the second direction D2 crossing the first direction D1. Some of the interconnections ICL overlaps the active regions ACT when viewed from the above. For example, a plurality of the interconnections ICL may be disposed over one active region ACT.

Peripheral contact plugs PPLG is disposed between the peripheral logic structures and the interconnections ICL in a cross-sectional view. Each of the peripheral contact plugs PPLG penetrates the filling insulating layer 130 and the peripheral protection layer 35 to be connected to the source/drain region SD or the peripheral gate pattern 23. At least one of the peripheral contact plugs PPLG may penetrate the residual spacer RS to be connected to the source/drain region SD. At least one of the peripheral contact plugs PPLG of the first region R1 is spaced apart from the residual spacers RS to be connected to the source/drain region SD between the peripheral gate structures 30 adjacent to each other in the first region R1. At least one of the peripheral contact plugs PPLG of the second region R2 penetrates the residual spacer RS to be connected to the source/drain region SD between the peripheral gate structures 30 adjacent to each other in the second region R2.

Peripheral contacts PCT is disposed on the filling insulating layer 130 of the peripheral circuit region PERI. Each of the peripheral contacts PCT may penetrate the interlayer insulating layer 140 so as to be connected to the peripheral contact plug PPLG. Thus, one of the source/drain regions SD is electrically connected to one of the interconnections ICL through the peripheral contact plug PPLG and the peripheral contact PCT interposed therebetween. Top surfaces of the peripheral contact plugs PPLG are substantially coplanar with the top surfaces of the word line contact plugs WPLG of the contact region CTR.

FIGS. 7 to 13 are cross-sectional views taken along lines I-I', II-II', and III-III' of FIG. 5 to illustrate a method of fabricating a semiconductor memory device according to an exemplary embodiment of the present inventive concept.

Figure 7:
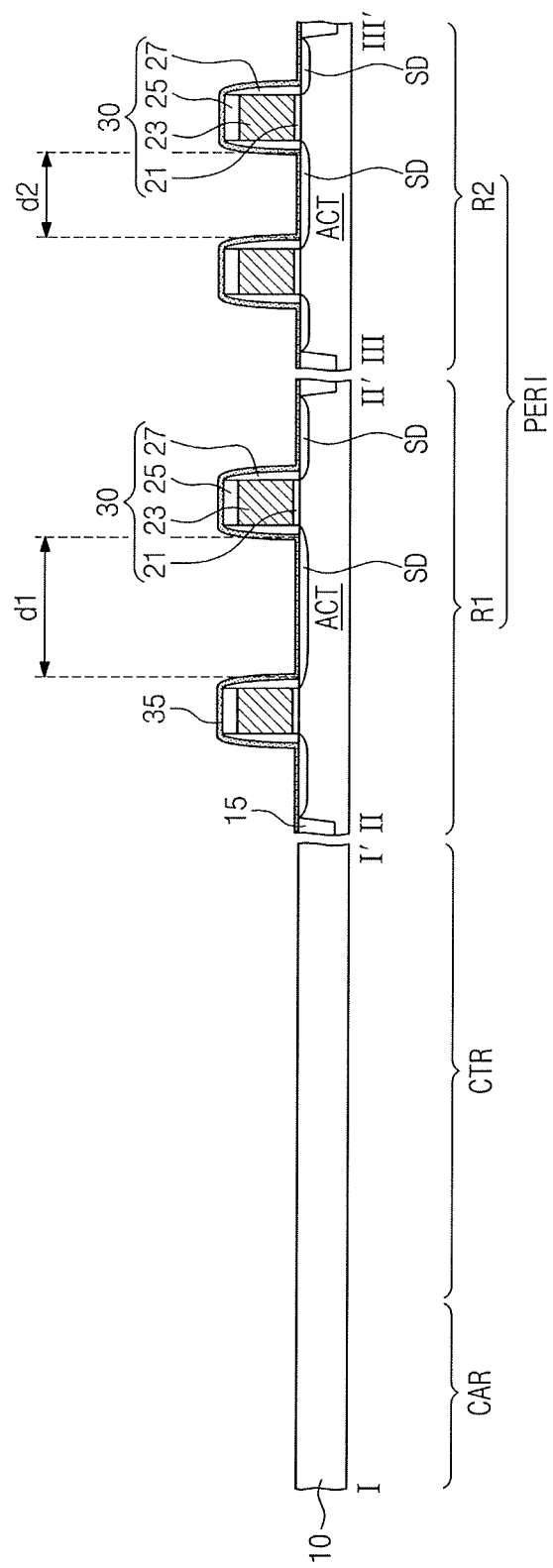
FIGS. 7 to 13 are cross-sectional views corresponding to lines I-I', II-II', and III-III' of FIG. 5 to illustrate a method for fabricating a semiconductor memory device according to an exemplary embodiment of the present inventive concept.

Referring to FIG. 7, a substrate 10 is prepared. The substrate 10 includes a cell array region CAR, a peripheral circuit region PERI, and a contact region CTR disposed between the cell array region CAR and the peripheral circuit region PERI. The substrate 10 may be a substrate including a material having a semiconductor property (e.g., a silicon wafer), a substrate including an insulating material (e.g., a glass substrate), or a semiconductor or conductor covered with an insulating material. The substrate 10 of the peripheral circuit region PERI includes active regions ACT defined by a device isolation layer 15. The active regions ACT may be doped with dopants of a first conductivity type. The peripheral circuit region PERI includes a first region R1 and a second region R2.

A peripheral logic structure is formed on the substrate 10 of each of the first and second regions R1 and R2. Forming the peripheral logic structures includes forming the lower and column decoders, the page buffer, and control circuits which are described with reference to FIG. 2. Peripheral transistors included in peripheral circuits are formed on the substrate 10 of each of the first and second regions R1 and R2 of the peripheral circuit region PERI, as shown in FIG. 7.

Forming of the peripheral transistors includes forming a peripheral gate structure 30 on the substrate 10, and forming source/drain regions SD in the active region ACT at both sides of the peripheral gate structure 30. The source/drain regions SD may be doped with dopants of which a second conductivity type is different from the first conductivity type of the active region ACT.

The peripheral gate structure 30 includes a peripheral gate dielectric pattern 21, a peripheral gate pattern 23, and a peripheral gate capping pattern 25 which are sequentially stacked on the substrate 10. The peripheral gate structure 30 further includes peripheral gate spacers 27 disposed on both sidewalls of the peripheral gate pattern 23. The peripheral gate structure 30 is formed in plurality. The plurality of peripheral gate structures 30 crosses the active region ACT to extend in a first direction D1 and is spaced apart from each other in a second direction D2 intersecting the first direction D1. A first distance d1 between the peripheral gate structures 30 adjacent to each other in the first region R1 is greater than a second distance d2 between the peripheral gate structures 30 adjacent to each other in the second region R2.

The peripheral gate dielectric pattern 21 may include at least one of a silicon oxide layer, a silicon nitride layer, a silicon oxynitride layer, and a high-k dielectric layer (e.g., a hafnium oxide layer). The peripheral gate pattern 23 may include at least one of a doped semiconductor (e.g., doped silicon), a conductive metal nitride (e.g., titanium nitride or tantalum nitride), a metal (e.g., tungsten or aluminum), a transition metal (e.g., titanium or tantalum), and a metal-semiconductor compound (e.g., a metal silicide). The peripheral gate capping pattern 25 and the peripheral gate spacer 27 may include a material having etch selectivity with respect to sacrificial layers SC included in a thin layer structure that will be described later. For example, if the sacrificial layers SC are formed of silicon nitride, the peripheral gate capping pattern 25 and the peripheral gate spacer 27 may be formed of silicon oxide.

Next, a peripheral protection layer 35 is formed on the substrate 10 of the peripheral circuit region PERI to cover the peripheral gate structures 30. For example, an insulating material may be deposited on an entire top surface of the substrate 10 having the peripheral gate structures 30, and the deposited insulating material may be patterned to form the peripheral protection layer 35. Thus, the peripheral protection layer 35 is formed on the substrate 10 of the peripheral circuit region PERI, exposing the substrate 10 of the cell array region CAR and the contact region CTR. The peripheral protection layer 35 may be formed of a nitride layer (e.g., a silicon nitride layer). The peripheral protection layer 35 may protect the peripheral transistors from mobile charges which may be generated in subsequent processes. A thickness of the peripheral protection layer 35 may be smaller than a vertical thickness of the peripheral gate pattern 23. Here, the vertical thickness means a length in a direction perpendicular to the top surface of the substrate 10. The peripheral protection layer 35 may be disposed on a portion of the peripheral logic structure.

Figure 8:
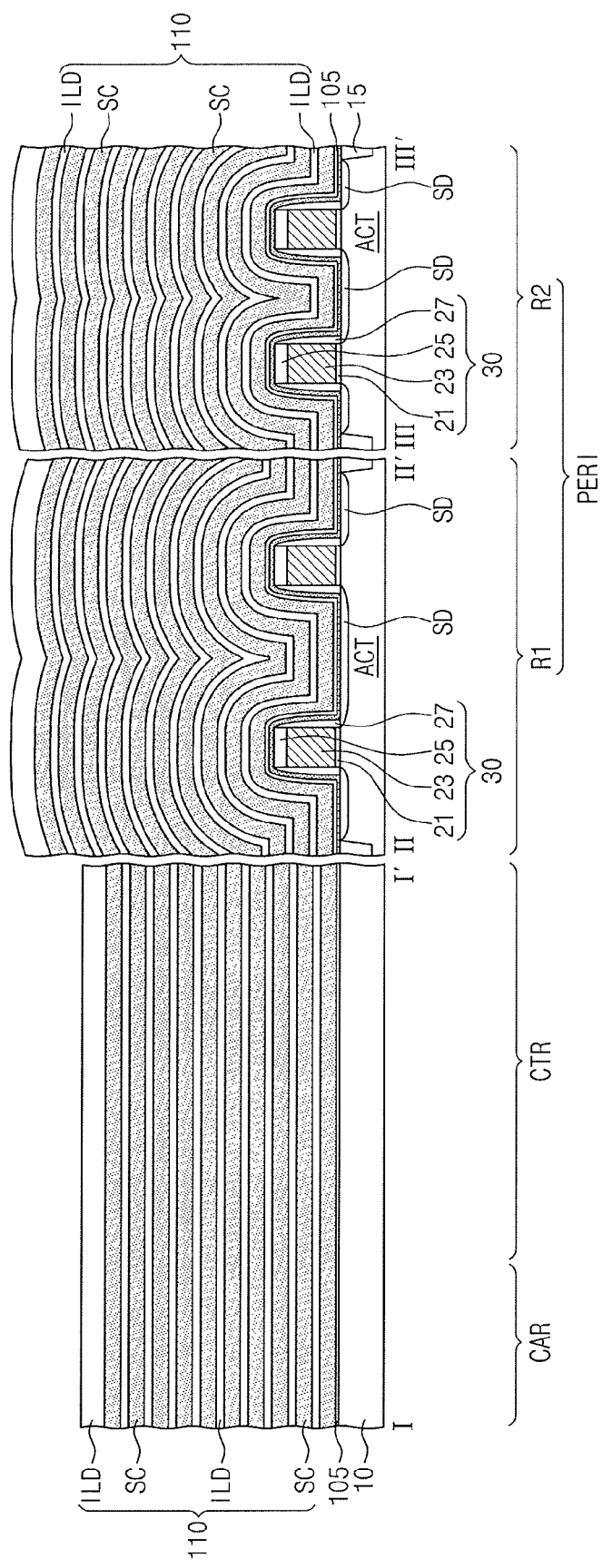

Referring to FIG. 8, a thin layer structure 110 is formed on an entire top surface of the substrate 10 having the peripheral logic structures. For example, the thin layer structure 110 is formed on the substrate 10 of the cell array region CAR and the contact region CTR, conformally covering the peripheral logic structures on the substrate 10 of the peripheral circuit region PERI. For example, the thin layer structure 110 is conformally formed on the entire top surface of the substrate 10 having the peripheral logic structures.

The thin layer structure 110 includes a plurality of insulating layers ILD and a plurality of sacrificial layers SC. The insulating layers ILD and the sacrificial layers SC are alternately and repeatedly stacked on the substrate 10 by deposition processes. A vertical thickness (i.e., a height) of the thin layer structure 110 in the cell array region CAR may be equal to or greater than a vertical thickness (e.g., a height) of the peripheral gate structure 30. For example, the height of the thin layer structure 110 in the cell array region CAR may be greater than about twice the height of the peripheral gate structure 30. A vertical thickness of each of the insulating layers ILD and sacrificial layers SC may be smaller than the vertical thickness (i.e., the height) of the peripheral gate structure 30. For example, the vertical thickness of each of the insulating layers ILD and sacrificial layers SC may be smaller than a vertical thickness of the peripheral gate pattern 23.

Thickness of the sacrificial layers SC of the thin layer structure 110 may be equal to each other. Alternatively, the thickness of at least one of the sacrificial layers SC may be different from those of others of the sacrificial layers SC. Thickness of the insulating layers ILD of the thin layer structure 110 may be equal to each other. Alternatively, the thickness of at least one of the insulating layers ILD may be different from those of others of the insulating layers ILD.

The sacrificial layers SC may be formed of a material having etch selectivity with respect to the insulating layers ILD in a wet etching process. For example, each of the insulating layers ILD may include at least one of a silicon oxide layer and a silicon nitride layer. Each of the sacrificial layers SC may be formed of a different material from the insulating layers ILD. For example, the sacrificial layers SC may include at least one of a silicon layer, a silicon oxide layer, a silicon carbide layer, and a silicon nitride layer. For example, the insulating layers ILD may include a silicon oxide layer. In addition, the insulating layers ILD may further include a high-k dielectric layer to easily generate the inversion regions, as described with reference to FIG. 4A. Here, the high-k dielectric layer may have a dielectric constant higher than that of a silicon oxide layer. For example, the high-k dielectric layer may include at least one of a silicon nitride layer and a silicon oxynitride layer.

A lower insulating layer 105 is formed on the entire top surface of the substrate 10 before the formation of the thin layer structure 110. For example, the lower insulating layer 105 is formed between the thin layer structure 110 and the substrate 10 of the cell array region CAR and the contact region CTR, and between the peripheral logic structure and the thin layer structure 110 of the peripheral circuit region PERI. The lower insulating layer 105 may be a silicon oxide layer that is formed by a thermal oxidation process. Alternatively, the lower insulating layer 105 may be a silicon oxide layer that is formed using a deposition technique. The lower insulating layer 105 may be thinner than the sacrificial layers SC and the insulating layers ILD.

To separate the thin layer structure 110 from the peripheral logic structure, an insulating layer (e.g., a silicon oxide layer) is formed on the substrate 10 having the peripheral logic structure before the formation of the thin layer structure 110. However, according to embodiments of the inventive concepts, the insulating layer for separating the thin layer structure 110 from the peripheral logic structure can be omitted. As a result, processes of fabricating the semiconductor memory device is simplified, so fabricating costs of the semiconductor memory device is reduced and uniformity of characteristics of the semiconductor memory device is improved.

Figure 9:
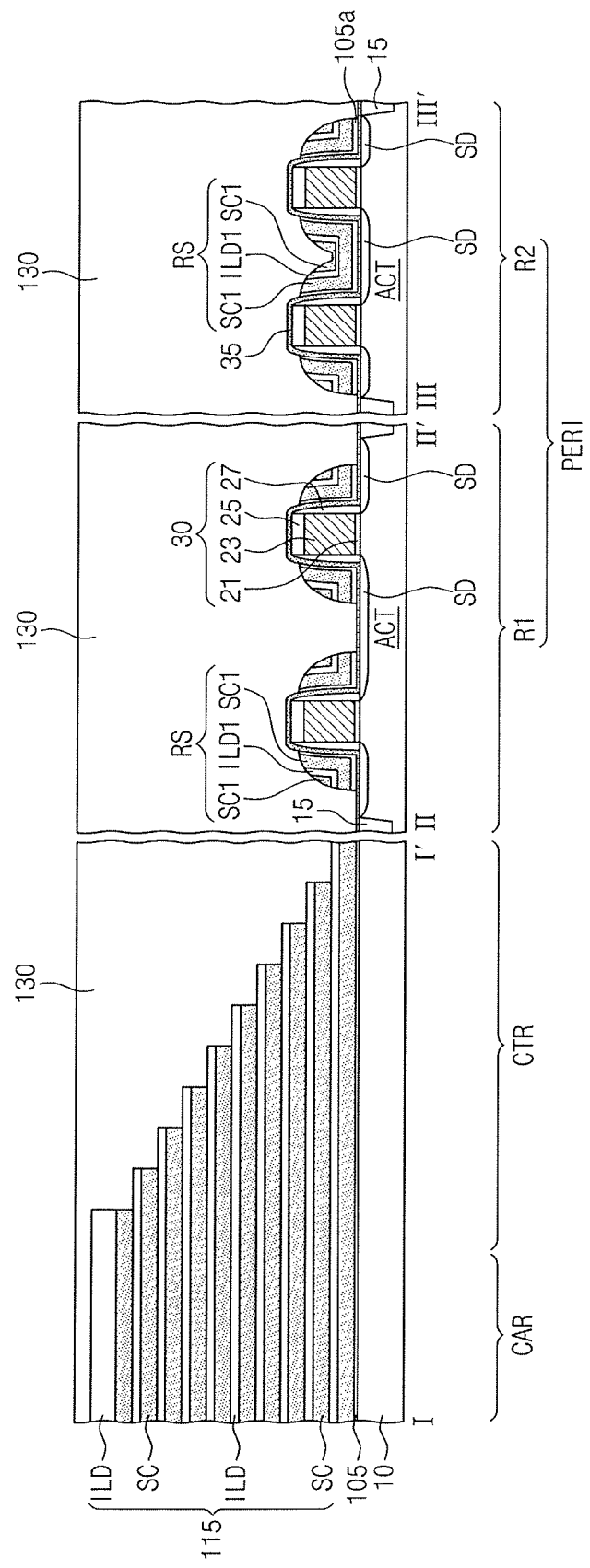

Referring to FIG. 9, the thin layer structure 110 of FIG. 8 is patterned to form a preliminary stack structure 115 on the substrate 10 of the cell array region CAR.

The preliminary stack structure 115 extends from the cell array region CAR into the contact region CTR to have a contact portion having a stepped shape. For example, the thin layer structure 110 of the contact region CTR is pattered to form the contact portion, having a stepwise structure, of the preliminary stack structure 115. Since the preliminary stack structure 115 has the contact portion of the stepwise structure, it is possible to easily realize electrical interconnection between conductive patterns to be formed in the cell array region CAR and peripheral circuits formed in the peripheral circuit region PERI.

A process of patterning the thin layer structure 110 may be performed plural times for the formation of the preliminary stack structure 115 described above. For example, patterning the thin layer structure 110 may include alternately and repeatedly performing a process of reducing a planar area of a mask pattern (not shown) and a process of etching the thin layer structure 110.

In the process of reducing the planar area of the mask pattern (not shown), a region exposed by the mask pattern may be enlarged to form the stepped shape in the preliminary stack structure 115. A width and a thickness of the mask pattern is reduced as the process of reducing the planar area of the mask pattern is repeatedly performed.

The number of the processes of etching the thin layer structure 110 may be changed depending on the number of the stacked sacrificial layers SC. As the process of the etching the thin layer structure 110 is repeatedly performed, end portions of the insulating layers ILD may be sequentially exposed from the end portion of a lowermost insulating layer ILD in the contact region CTR. For example, top surfaces of the end portions of the insulating layers ILD are exposed in the contact region CTR. Alternatively, top surfaces of end portions of the sacrificial layers SC of the preliminary stack structure 115 may be exposed instead of the top surfaces of the end portions of the insulating layers ILD in the contact region CTR.

Since the preliminary stack structure 115 having the stepwise structure is formed, the end portions of the insulating layers ILD and sacrificial layers SC are disposed on the substrate 10 of the contact region CTR. Areas of the insulating layers ILD and sacrificial layers SC are reduced as the insulating layers ILD and the sacrificial layers SC are distant from the substrate 10. For example, horizontal distances between the peripheral circuit region PERI and one-sidewalls of the sacrificial layers SC and insulating layers ILD may increase as a distance between the substrate 10, and the sacrificial layers SC and the insulating layers ILD increases.

The thin layer structure 110 of FIG. 8 is patterned to remove the thin layer structure 110 disposed in the peripheral circuit region PERI. For example, the preliminary stack structure 115 is formed to expose the peripheral protection layer 35 of the peripheral circuit region PERI. The thin layer structure 110 is patterned to form the preliminary stack structure 115 having the stepwise structure disposed in the contact region CTR, and portions of the thin layer structure 110 remain on the sidewalls of the peripheral gate structures 30 with the peripheral protection layer 35 interposed between two adjacent peripheral gate structures 30.

For example, since the thin layer structure 110 is conformally formed on the entire top surface of the substrate 10 having the peripheral logic structure, the thin layer structure 110 covers an entire portion of the peripheral logic structure. Thus, the thin layer structure 110 is formed on both sidewalls of the peripheral gate structure 30. An anisotropic etching process may be applied to remove the thin layer structure 110. For example, the anisotropic etching process may be controlled such that the thin layer structure 110 disposed on the peripheral gate structure 30 remain to have a spacer shape. Such remaining thin layer structure 110 having the spacer shape may be referred to as a residual spacer RS. The anisotropic etching process may be applied at the same time to form the preliminary stack structure 115 and the residual spacer RS. Alternatively, the anisotropic etching process may be applied to form the residual spacer RS only. For example, the residual spacer RS is formed on the both sidewalls of the peripheral gate structure 30. The residual spacer RS includes a portion of the sacrificial layers SC and a portion of the insulating layers ILD which are included in the thin layer structure 110. The residual spacer RS includes a sacrificial pattern SC1 and an insulating pattern ILD1 that are stacked. A material and a thickness of the sacrificial pattern SC1 may be the same as those of the lowermost sacrificial layer SC of the thin layer structure 110, and a material and a thickness of the insulating pattern ILD1 may be the same as those of the lowermost insulating layer ILD of the thin layer structure 110. For example, the residual spacer RS may include at least two sacrificial patterns SC1 and at least two insulating patterns ILD1 which are alternately stacked. The numbers of the sacrificial pattern SC1 and the insulating pattern ILD1 included in the residual spacer RS may be changed depending on the vertical thickness of each of the insulating layers ILD and the sacrificial layers SC, the height of the peripheral gate structure 30, and/or a process recipe for forming the preliminary stack structure 115. Each of the residual spacers RS extends along each sidewall of the peripheral gate structure 30 in the first direction D1. Each of the residual spacers RS overlaps the source/drain region SD when viewed from the above. The top end of the residual spacer RS is lower than the top surface of the peripheral gate structure 30. For example, a top end of the residual spacer RS may be disposed at substantially the same level (or height) as the top surface of the peripheral gate structure 30.

At least a portion of the residual spacers RS disposed on the sidewalls of the peripheral gate structures 30 in the second region R2 may have a different shape from the residual spacers RS disposed on the sidewalls of the peripheral gate structures 30 in the first region R1. For example, the residual spacers RS of the first region R1 are locally disposed on the both sidewalls of each of the peripheral gate structures 30, respectively. Thus, the residual spacers RS between the peripheral gate structures 30 adjacent to each other in the first region R1 are spaced apart from each other. In this case, the residual spacer RS of the first region R1 includes the sacrificial pattern SC1 having a substantially 'L'-shaped cross section and the insulating pattern ILD1 having a substantially 'L'-shaped cross section. On the other hand, the residual spacer RS disposed between the peripheral gate structures 30 adjacent to each other in the second region R2 is disposed on sidewalls, facing each other, of the adjacent peripheral gate structures 30 and may extend onto the substrate 10 between the adjacent peripheral gate structures 30. In other words, the residual spacer 30 formed in one body is disposed between the adjacent peripheral gate structures 30 of the second region R2. In this case, the residual spacer RS between the adjacent peripheral gate structures 30 in the second region R2 includes the sacrificial pattern SC1 having a substantially 'U'-shaped cross section and the insulating pattern ILD1 having a substantially 'U'-shaped cross section. This is because an etching amount of the thin layer structure 110 formed in a relatively narrow space between the adjacent peripheral gate structures 30 of the second region R2 is less than that of the thin layer structure 110 formed in a relatively wide space between the adjacent peripheral gate structures 30 of the first region R1.

A lower insulating pattern 105a is formed between the peripheral gate structure 30 and the residual spacer RS. The lower insulating pattern 105a may include the same material as the lower insulating layer 105 disposed between the substrate 10 and the stack structure 120. In the forming of the residual spacers RS using an anisotropic etching process, a portion of the lower insulating layer 105 disposed between the peripheral logic structure and the residual spacer RS remains unetched to form the lower insulating pattern 105a.

Next, a filling insulating layer 130 is formed on the substrate 10 of the peripheral circuit region PERI and the contact region CTR. The filling insulating layer 130 may be conformally deposited along surfaces of structures of the regions CAR, CTR, and PERI by a deposition technique. A height difference may occur between the deposited filling insulating layer 130 of the cell array region CAR and the deposited filling insulating layer 130 of the peripheral circuit region PERI. Thus, a planarization process may be performed on the deposited filling insulating layer 130 to remove the height difference between the cell array region CAR and the peripheral circuit region PERI. The filling insulating layer 130 may have a planarized top surface by the planarization process.

For example, the filling insulating layer 130 may be formed of at least one of a high-density plasma (HDP) oxide layer, a tetra ethyl ortho silicate (TEOS) layer, a plasma-enhanced TEOS (PE-TEOS) layer, a $O_3$-TEOS layer, an undoped silicate glass (USG) layer, a phosphosilicate Glass (PSG) layer, a borosilicate Glass (BSG) layer, a borophosphosilicate glass (BPSG) layer, a fluoride silicate glass (FSG) layer, a spin-on-glass (SOG) oxide layer, a Tonen SilaZene (TOSZ) layer, and a combination thereof. The filling insulating layer 130 may include or may further include a silicon nitride layer, a silicon oxynitride layer, or a low-k dielectric layer.

Figure 10:
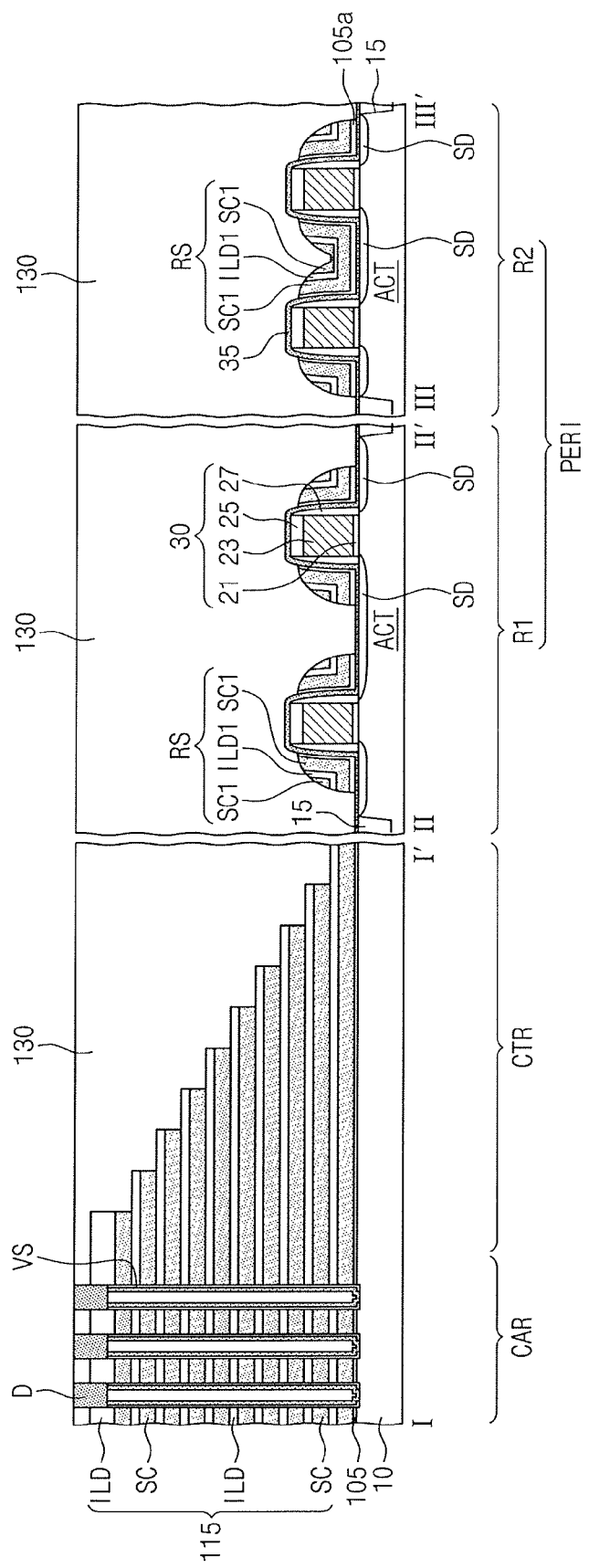

Referring to FIG. 10, vertical structures VS penetrating the preliminary stack structure 115 and a data storage layer are formed on the substrate 10 of the cell array region CAR. The vertical structures VS may include a semiconductor material or a conductive material.

Forming of the vertical structures VS may include forming openings penetrating the preliminary stack structure 115, and forming a semiconductor pattern in each of the openings. Each of the vertical structures VS may include the semiconductor pattern disposed in each of the openings.

A mask pattern (not shown) may be formed on the preliminary stack structure 115, and the preliminary stack structure 115 may be anisotropically etched using the mask pattern (not shown) as an etch mask to form the openings. The top surface of the substrate 10 under the openings may be over-etched by the anisotropic etching process. Thus, the top surface of the substrate 10, which is exposed by the openings, may be recessed by a predetermined depth. In addition, a width of a lower portion of the opening may be smaller than a width of an upper portion of the opening by the anisotropic etching process. When viewed from the above, the openings may be arranged along one direction or may be arranged in a zigzag form along one direction.

Forming of the semiconductor pattern in each of the openings may include forming the semiconductor spacer SP2 of FIG. 4A covering an inner sidewall of each of the openings, and forming the semiconductor body portion SP1 of FIG. 4A connected to the substrate 10, as described with reference to FIG. 4A. The semiconductor pattern may include silicon (Si), germanium (Ge), or silicon-germanium (SiGe). The semiconductor pattern may be doped with dopants or may be in an undoped state or an intrinsic state. The semiconductor pattern may be in a single-crystalline state, a poly-crystalline state, or an amorphous state. The semiconductor pattern may have a hollow pipe shape or a hollow macaroni shape. In this case, a bottom end of the semiconductor pattern is closed. In addition, a conductive pad D is formed in a top end portion of the vertical structure VS. The conductive pad D may be a dopant region doped with dopants or may be formed of a conductive material.

A portion of the data storage layer may be formed before the formation of the vertical structures VS. The vertical pattern of the data storage layer described with reference to FIG. 4A may be formed in each of the openings before the formation of the vertical structures VS. The vertical pattern may be one thin layer or a plurality of thin layers. For example, the vertical pattern may include a tunnel dielectric layer of a charge trap-type flash memory transistor. The tunnel dielectric layer may include a material of which an energy band gap is greater than that of a charge storage layer. For example, the tunnel dielectric layer may include a silicon oxide layer. In addition, the vertical pattern may further include the charge storage layer of the charge trap-type flash memory transistor. The charge storage layer may include an insulating layer which is rich with trap sites (e.g., a silicon nitride layer), a floating gate electrode, or an insulating layer including conductive nano dots.

Figure 11:
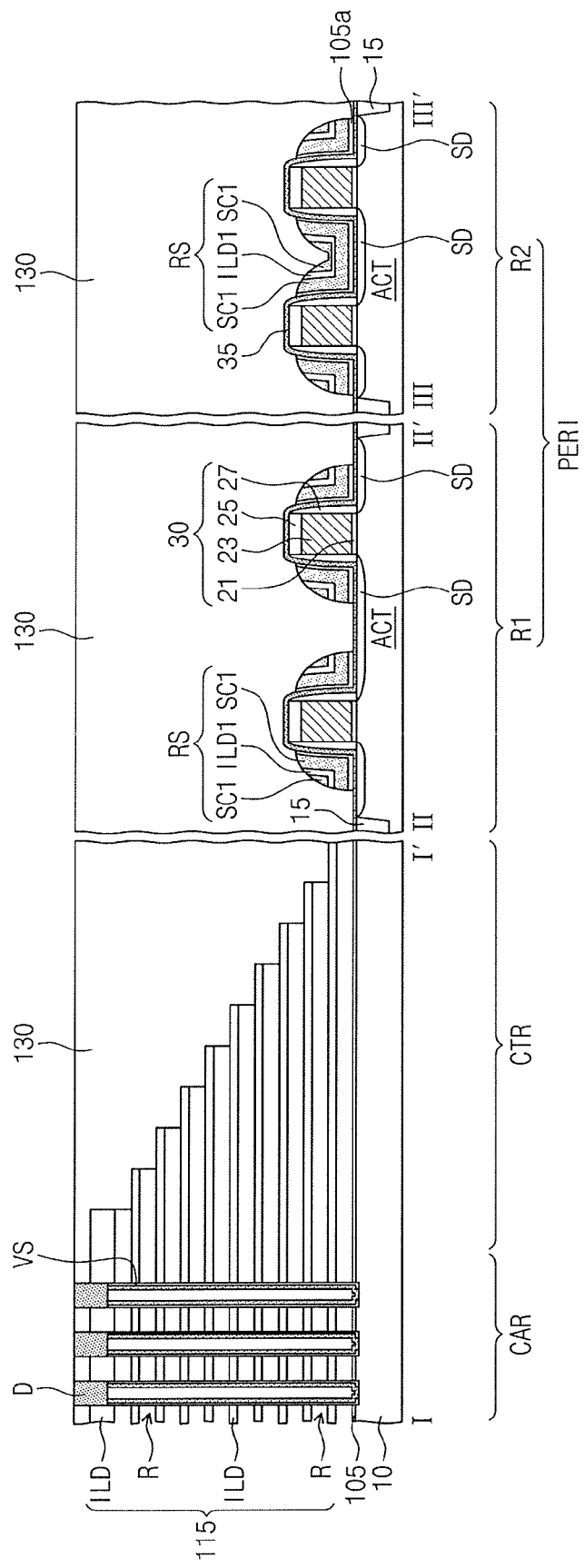
Figure 12:
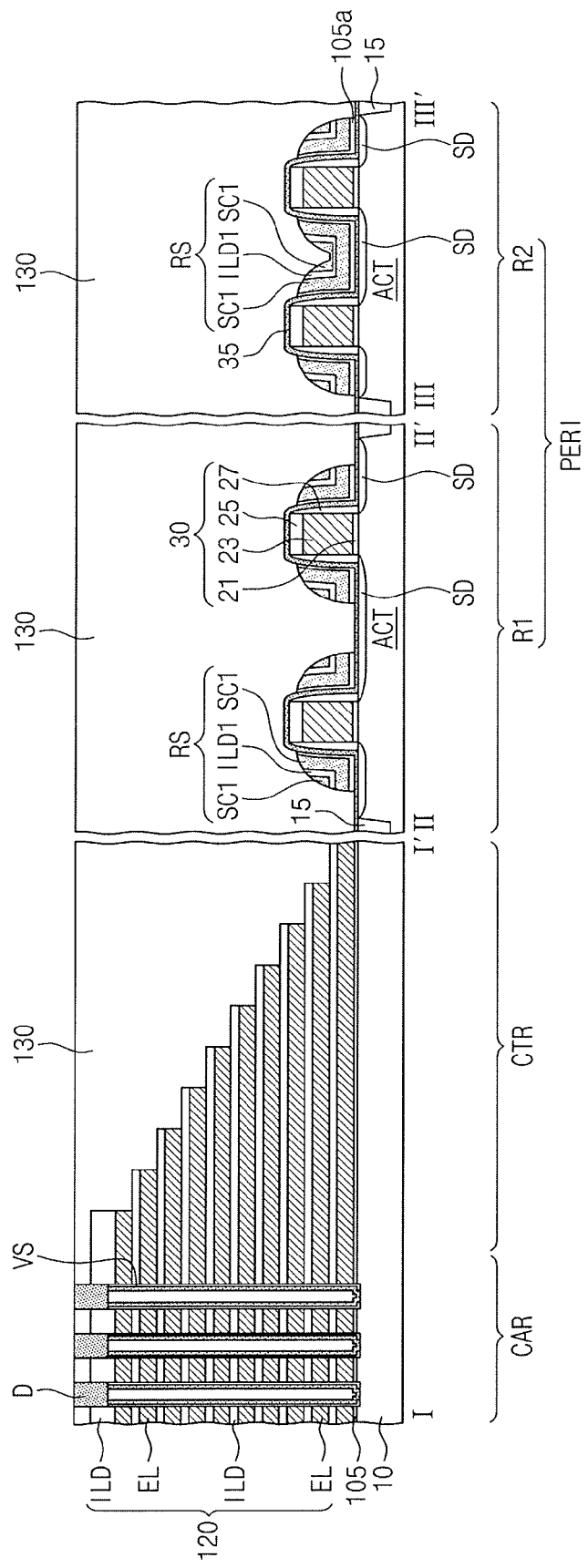

If the sacrificial layers SC are formed of an insulating material, a process of replacing the sacrificial layers SC with conductive patterns may be performed after the formation of the vertical structures VS, as illustrated in FIGS. 11 and 12.

Referring to FIG. 11, the sacrificial layers SC is removed to form recess regions R between the insulating layers ILD. The recess regions R may be formed by isotropically etching the sacrificial layers SC using an etch recipe having etch selectivity with respect to the insulating layers ILD and the vertical structures VS. At this time, the sacrificial layers SC is completely removed by the isotropic etching process. For example, if the sacrificial layers SC are formed of silicon nitride and the insulating layers ILD are formed of silicon oxide, the isotropic etching process for removing the sacrificial layers SC may be performed using an etching solution including phosphoric acid.

Referring to FIG. 12, an insulating pattern is formed to cover inner surfaces of the recess regions R, and conductive patterns is formed to fill the recess regions R, respectively. The insulating pattern covering the inner surfaces of the recess regions may correspond to the horizontal pattern HP of the data storage layer described with reference to FIG. 4A. For example, the insulating pattern may be a single thin layer or a plurality of thin layers. For example, the insulating pattern may include a blocking dielectric layer of the charge trap-type flash memory transistor. The blocking dielectric layer may include a material of which an energy band gap is smaller than that of the tunnel dielectric layer and greater than that of the charge storage layer. For example, the blocking dielectric layer may include at least one of high-k dielectric layers such as an aluminum oxide layer and a hafnium oxide layer.

Forming of the conductive patterns may include forming electrodes EL constituting a stack structure 120 in the recess regions R.

Figure 13:
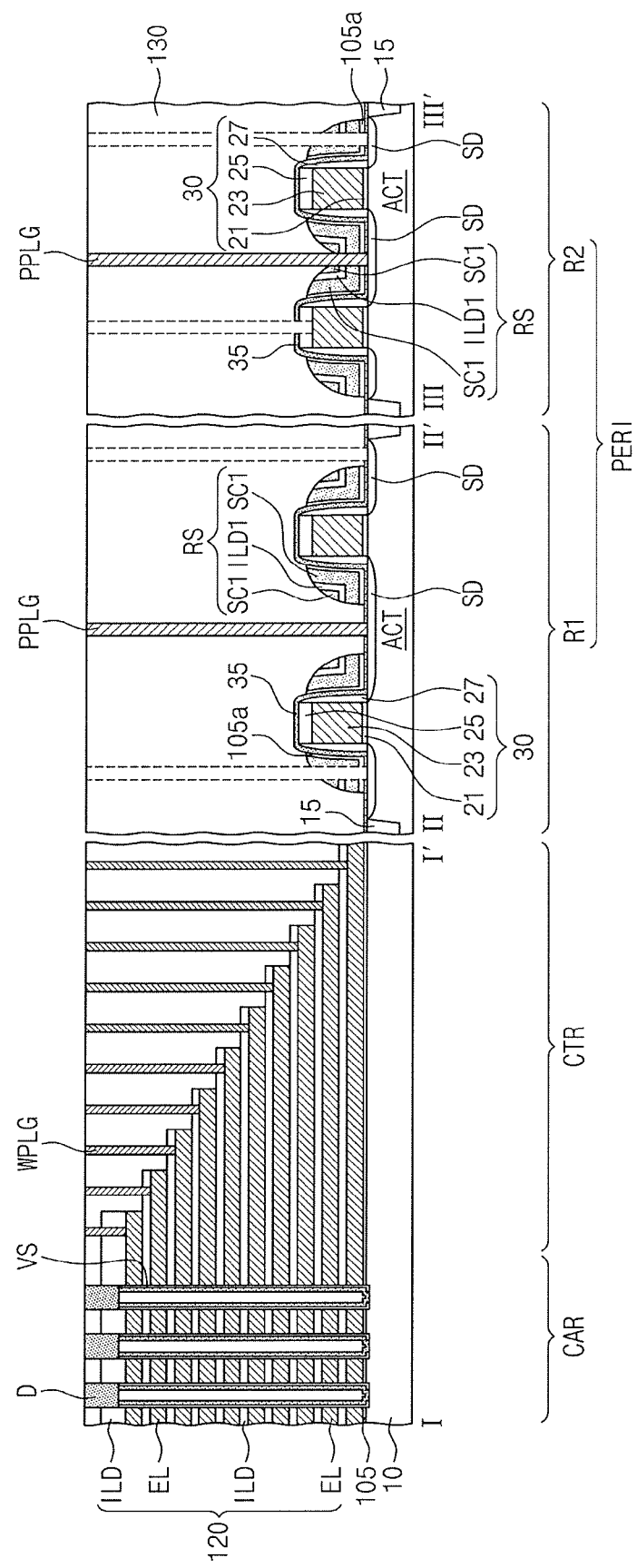

Referring to FIG. 13, word line contact plugs WPLG are formed in the contact region CTR, and peripheral contact plugs PPLG are formed in the peripheral circuit region PERI.

Forming of the word line contact plugs WPLG and the peripheral contact plugs PPLG may include forming contact holes penetrating the filling insulating layer 130 and the peripheral protection layer 35 in the contact region CTR and the peripheral circuit region PERI and filling the contact holes with a conductive material. For example, the contact plugs WPLG and PPLG may include a metallic material (e.g., tungsten). In this case, forming of the contact plugs WPLG and PPLG may include sequentially forming a barrier metal layer (e.g., a metal nitride layer) and a metal layer (e.g., a tungsten layer).

The word line contact plugs WPLG are respectively connected to the electrodes EL formed at different heights from each other. For example, since the stack structure 120 has the stepwise structure, the word line contact plugs WPLG is respectively connected to end portions of the electrodes EL disposed at different heights from each other.

Each of the peripheral contact plugs PPLG is connected to the peripheral gate pattern 23 or the source/drain region SD included in the peripheral circuit. For example, some of the peripheral contact plugs PPLG penetrate the residual spacers RS to be connected to the source/drain regions SD, and the other peripheral contact plugs PPLG are spaced apart from the residual spacers RS to be connected to the source/drain regions SD. For example, one of the peripheral contact plugs PPLG of the first region R1 is spaced apart from the residual spacers RS and is connected to the source/drain region SD between the peripheral gate structures 30 adjacent to each other in the first region R1. One of the peripheral contact plugs PPLG of the second region R2 penetrates the residual spacer RS to be connected to the source/drain region SD between the peripheral gate structures 30 adjacent to each other in the second region R2.

Referring back to FIG. 6, an interlayer insulating layer 140 is formed on the filling insulating layer 130, and bit line contact plugs BPLG is then formed to be connected to the vertical structures VS in the cell array region CAR. Word line contacts WCT are formed to be connected to the word line contact plugs WPLG in the contact region CTR. Peripheral contacts PCT are formed to be connected to the peripheral contact plugs PPLG in the peripheral circuit region PERI.

Next, a plurality of interconnections ICL is formed on the interlayer insulating layer 140 of the peripheral circuit region PERI. The interconnections ICL extends in the second direction D2 of FIG. 5 crossing the peripheral gate pattern 23. The interconnections ICL extend from the peripheral circuit region PERI to the cell array region CAR. For example, the interconnections ICL may electrically connect the memory cells of the cell array region CAR to the peripheral circuits of the peripheral circuit region PERI.

Bit lines BL are formed in the cell array region CAR, and connection lines CL are formed in the contact region CTR. The interconnections ICL, the bit lines BL, and the connection lines CL may be formed at the same time. For example, a conductive layer may be deposited on the interlayer insulating layer 140, and the deposited conductive layer may be patterned to form the interconnections ICL, the bit lines BL, and the connection lines CL at the same time.

According to an exemplary embodiment of the present inventive concept, after the thin layer structure 110 is formed on the entire top surface of the substrate 10 having the peripheral logic structure, the thin layer structure 110 is patterned to form the preliminary stack structure 115 for the formation of the stack structure 120 in the cell array region CAR. Thus, the processes of forming the stack structure 120 may be simplified to reduce the fabricating costs of the semiconductor memory device and to increase the uniformity of the characteristics of the semiconductor memory device.

Figure 14:
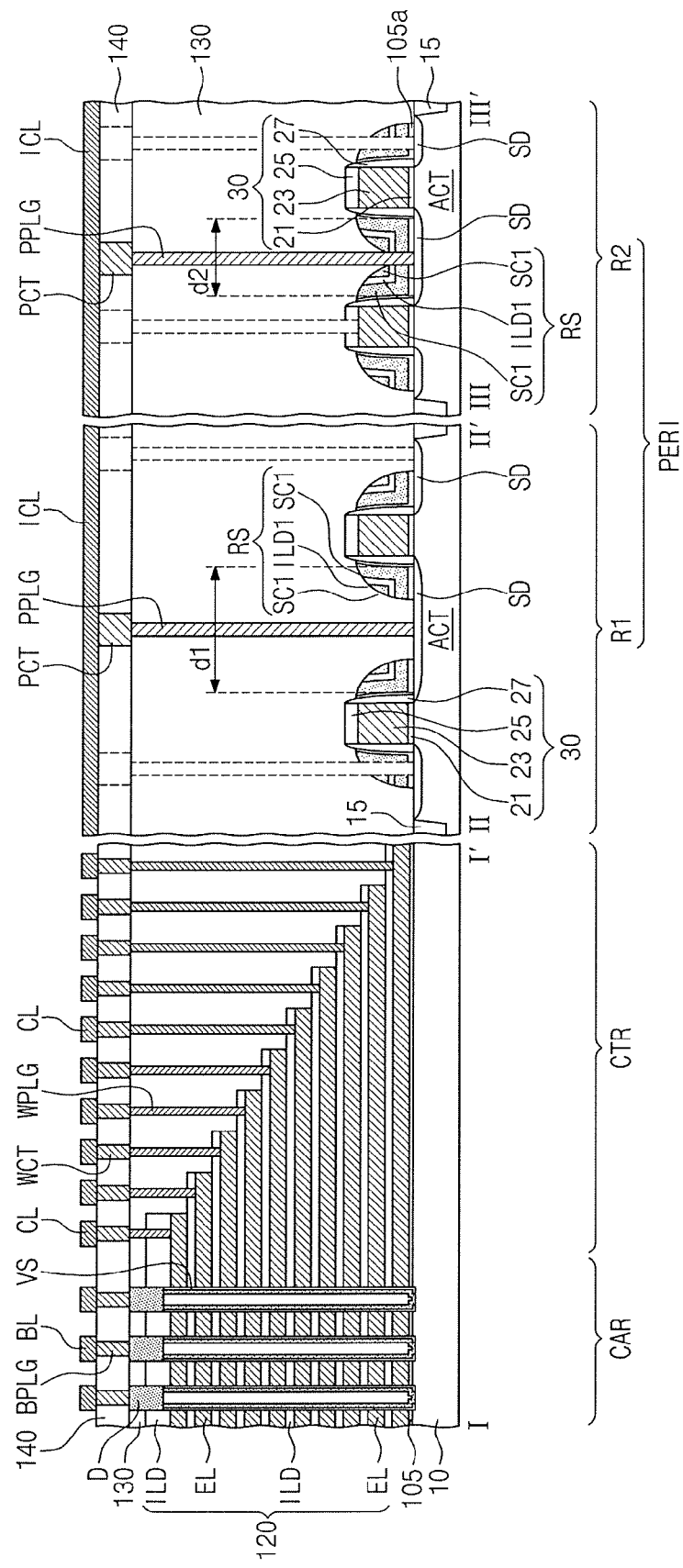
FIG. 14 is a cross-sectional view taken along lines I-I', II-II', and III-III' of FIG. 5 to illustrate a semiconductor memory device according to other embodiments of the inventive concepts.

FIG. 14 is a cross-sectional view taken along lines I-I', II-II', and III-III' of FIG. 5 to illustrate a semiconductor memory device according to an exemplary embodiment of the inventive concept. For the purpose of ease and convenience in explanation, the descriptions to the same elements as in the above embodiment will be omitted or mentioned briefly.

A semiconductor memory device of FIG. 14 does not include the peripheral protection layer 35 of FIG. 6. Other elements of the semiconductor memory device of FIG. 14 may be substantially the same as corresponding elements of the semiconductor memory device of FIG. 6. As described above, the peripheral protection layer 35 may protect the peripheral transistors of the peripheral circuit region PERI from the mobile charges generated during the fabrication process of the semiconductor memory device. In this case, the residual spacers RS formed on the both sidewalls of the peripheral gate structure 30 may perform the function of the peripheral protection layer 35 of FIG. 6. The peripheral logic structure in the semiconductor memory device of FIG. 14 does not include the peripheral protection layer 35 of FIG. 6. Thus, it is possible to simplify the processes of fabricating the semiconductor memory device while maintaining electrical characteristics of the semiconductor memory device.

Figure 15:
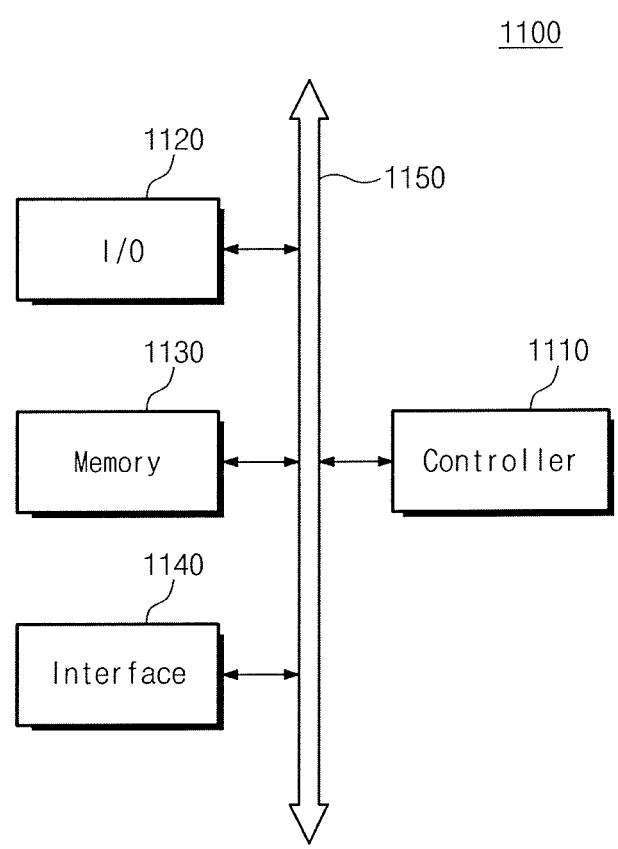
FIG. 15 is a schematic block diagram illustrating a memory system including a semiconductor memory device according to an exemplary embodiment of the present inventive concept.

FIG. 15 is a schematic block diagram illustrating a memory system including a semiconductor memory device according to an exemplary embodiment of the present inventive concept.

Referring to FIG. 15, a memory system 1100 may be applied to a personal digital assistant (PDA), a portable computer, a web tablet, a wireless phone, a mobile phone, a digital music player, a memory card, or other electronic products receiving and/or transmitting information data by wireless.

The memory system 1100 includes a controller 1110, an input/output (I/O) unit 1120, a memory device 1130, an interface unit 1140, and a data bus 1150. The memory device 1130 and the interface unit 1140 may communicate with each other through the data bus 1150.

The controller 1110 may include at least one of a microprocessor, a digital signal processor, a microcontroller, or other logic devices. Functions of the other logic devices may be a similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include a semiconductor memory device according to an exemplary embodiment of the inventive concept. The memory device 1130 may further include at least one of another type of semiconductor memory devices and volatile random access memory devices.

The interface unit 1140 may transmit electrical data to a communication network or may receive electrical data from a communication network.

Figure 16:
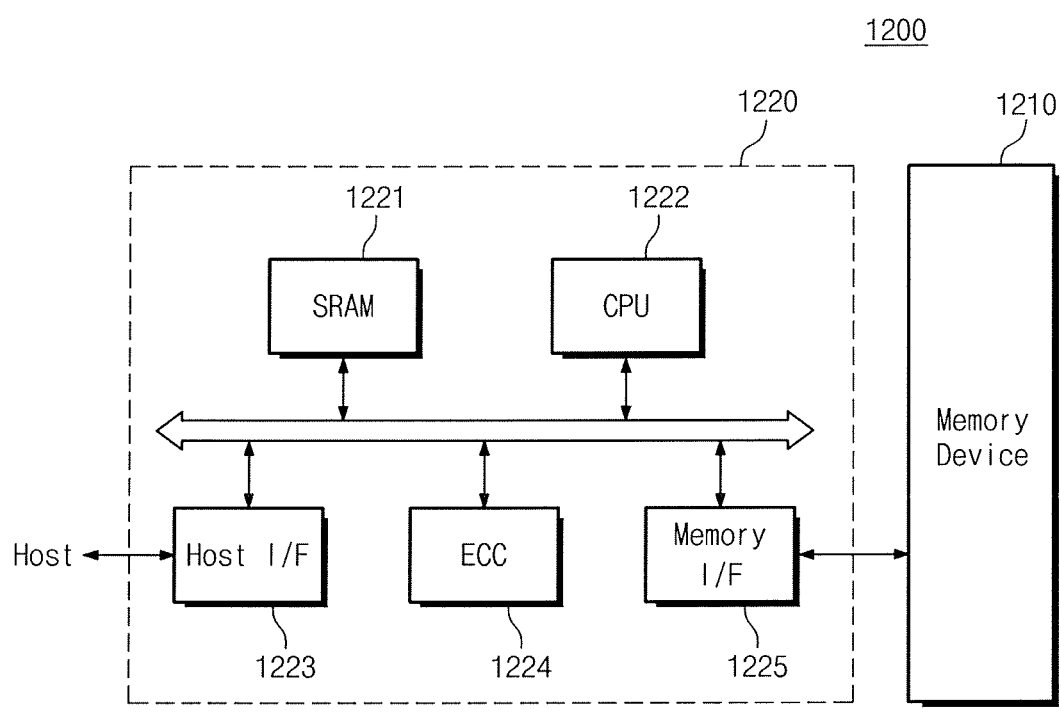
FIG. 16 is a schematic block diagram illustrating a memory card including a semiconductor memory device according to an exemplary embodiment of the present inventive concept.

FIG. 16 is a schematic block diagram illustrating a memory card including a semiconductor memory device according to an exemplary embodiment of the present inventive concept.

Referring to FIG. 16, a memory card 1200 for storing high-capacity data includes a flash memory device 1210 implemented with at least one of the semiconductor memory devices according to the aforementioned embodiments of the inventive concepts. The memory card 1200 may further include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the data storage device 1200 and the host. An error check and correction (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may further include a read only memory (ROM) storing code data for interfacing with the host.

Figure 17:
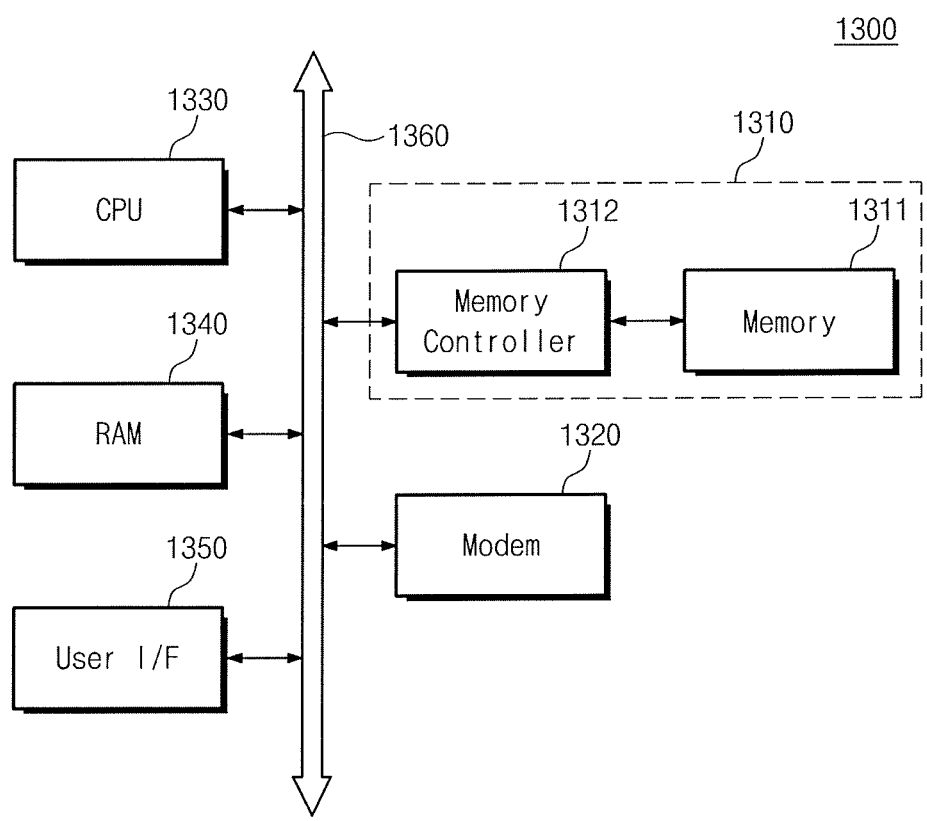
FIG. 17 is a schematic block diagram illustrating an information processing system including a semiconductor memory device according to an exemplary embodiment of the present inventive concept.

FIG. 17 is a schematic block diagram illustrating an information processing system including a semiconductor memory device according to an exemplary embodiment of the present inventive concept.

Referring to FIG. 17, an information processing system 1300 (e.g., a mobile device or a desk top computer) includes a memory system 1310 including a semiconductor memory device according to an exemplary embodiment of the present inventive concept. The information processing system 1300 further includes a modem 1320, a central processing unit (CPU) 1330, a random access memory (RAM) device 1340, and a user interface unit 1350 which are electrically connected to the memory system 1310 through a system bus 1360. The memory system 1310 is a substantially same as the memory system or the memory card described above. The memory system 1310 may store data inputted from an external system and/or data processed by the CPU 1330. For example, the memory system 1310 may be realized as a solid state disk (SSD). In this case, the information processing system 1300 may stably store massive data into the flash memory system. In addition, as reliability of the memory system 1310 may increase, the memory system 1310 may reduce a resource consumed for correcting errors. Thus, the information processing system 1300 may perform a high-speed data exchange function. Even though not shown in the drawings, an application chipset, a camera image processor (CIS), and an input/output unit may further be provided in the information processing system 1300.

The memory device or the memory system according to an exemplary embodiment may be encapsulated using various packaging techniques. For example, the memory device or the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to an exemplary embodiment of the present inventive concept, the thin layer structure may be formed on the entire top surface of the substrate having the peripheral logic structure, and the thin layer structure may be patterned to form the stack structure in the cell array region. Thus, the processes of forming the stack structure may be simplified to reduce the fabricating costs of the semiconductor memory devices and to increase the uniformity of the characteristics of the semiconductor memory devices.

In addition, the residual spacers may be formed on the sidewalls of the peripheral gate structures. In some embodiments, the residual spacers may perform the function of the peripheral protection layer. Thus, the peripheral protection layer may be omitted to simplify the processes of fabricating the semiconductor memory device while maintaining the electrical characteristics of the semiconductor memory device.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, the method comprising:
providing a substrate including a cell array region and a peripheral circuit region;
forming at least one peripheral gate structure disposed on the peripheral circuit region,
forming a thin layer structure by alternately and repeatedly stacking a plurality of sacrificial layers and a plurality of insulating layers on an entire top surface of the peripheral circuit region having the peripheral gate structure; and
repeating a process of patterning the thin layer structure to sequentially expose top surfaces of the insulating layers between the cell array region and the peripheral circuit region to form a stack structure on the cell array region and at least one residual space on one sidewall of the peripheral gate structure.

2. The method of claim 1,
wherein the at least one residual spacer comprises a sacrificial pattern and an insulating pattern on the sacrificial pattern, and wherein the insulating pattern includes substantially the same material as the plurality of insulating layers of the stack structure.

3. The method of claim 2,
wherein the sacrificial pattern includes a material having etch selectivity with respect to the insulating pattern, and
wherein the sacrificial pattern includes substantially the same material as the plurality of sacrificial layers of the stack structure.

4. The method of claim 1, further comprising:
forming a peripheral protection layer covering the peripheral gate structure before the forming of the thin layer structure,
wherein the peripheral protection layer exposes the cell array region.

5. The method of claim 4, wherein the at least one peripheral gate structure comprises:
a peripheral gate pattern disposed on the substrate; and
a peripheral gate spacer disposed on a sidewall of the peripheral gate pattern,
wherein the peripheral protection layer includes a material having etch selectivity with respect to the peripheral gate spacer.

6. The method of claim 1, further comprising:
forming source/drain regions in the substrate at both sides of the at least one peripheral gate structure before the forming of the thin layer structure,
wherein the at least one residual spacer overlaps with one of the source/drain regions.

7. The method of claim 6, further comprising:
forming a plurality of peripheral contact plugs connected to the source/drain regions,
wherein at least one of the peripheral contact plugs penetrates the at least one residual spacer.

8. The method of claim 1, further comprising:
a plurality of vertical structures penetrating the stack structure on the cell array region; and
a data storage layer disposed between the plurality of vertical structures and the stack structure.

9. A method of fabricating a semiconductor device, the method comprising:
providing a substrate including a cell array region and a peripheral circuit region;
forming at least one peripheral gate structure disposed on the peripheral circuit region,
forming a thin layer structure by alternately and repeatedly stacking a plurality of sacrificial layers and a plurality of insulating layers on the cell array region and the peripheral circuit region; and
repeating a process of patterning the thin layer structure to form a stack structure having a stair-step structure between the cell array region and the peripheral circuit region and at least one residual spacer on one sidewall of the peripheral gate structure,
wherein the at least one residual spacer comprises a portion of at least one of sacrificial layers and a portion of at least one of insulating layers.

10. The method of claim 9, further comprising:
forming a peripheral protection layer covering the at least one peripheral gate structure before the forming of the thin layer structure,
wherein the peripheral protection layer exposes the cell array region.

11. The method of claim 9, further comprising:
forming source/drain regions in the substrate at both sides of the at least one peripheral gate structure before the forming of the thin layer structure,
wherein the at least one residual spacer overlaps with one of the source/drain regions.

12. The method of claim 10, further comprising:
forming a plurality of peripheral contact plugs connected to the source/drain regions,
wherein at least one of the peripheral contact plugs penetrates the at least one residual spacer.

* * * * *